(12) United States Patent
Inomata et al.

(10) Patent No.: US 8,125,745 B2
(45) Date of Patent: Feb. 28, 2012

(54) MAGNETIC THIN FILM, AND MAGNETORESISTANCE EFFECT DEVICE AND MAGNETIC DEVICE USING THE SAME

(75) Inventors: Kouichiro Inomata, Sendai (JP); Nobuki Tezuka, Sendai (JP)

(73) Assignee: Japan Science and Technology Agency, Saitama (JP)

( * ) Notice: Subject to any disclaimer, the term of this patent is extended or adjusted under 35 U.S.C. 154(b) by 673 days.

(21) Appl. No.: 12/298,529

(22) PCT Filed: Apr. 27, 2007

(86) PCT No.: PCT/JP2007/059226
§ 371 (c)(1),
(2), (4) Date: Oct. 25, 2008

(87) PCT Pub. No.: WO2007/126071
PCT Pub. Date: Nov. 8, 2007

(65) Prior Publication Data
US 2009/0097168 A1 Apr. 16, 2009

(30) Foreign Application Priority Data
Apr. 27, 2006 (JP) .................................. 2006-123502

(51) Int. Cl.
*G11B 5/127* (2006.01)
(52) U.S. Cl. .................................. 360/324.1; G9B/5.04
(58) Field of Classification Search ............... 360/324.1; G9B/5.04
See application file for complete search history.

(56) References Cited

U.S. PATENT DOCUMENTS

| 2003/0103299 | A1 | 6/2003 | Saito et al. |
| 2004/0114283 | A1 | 6/2004 | Felser |
| 2005/0074634 | A1 | 4/2005 | Hasegawa et al. |
| 2005/0195532 | A1* | 9/2005 | Sugiyama et al. ............ 360/322 |
| 2006/0044703 | A1 | 3/2006 | Inomata et al. |

FOREIGN PATENT DOCUMENTS

| JP | 2003-338644 A | 11/2003 |
| JP | 2004-221526 A | 8/2004 |

(Continued)

OTHER PUBLICATIONS

Miyazaki et al., "Spin polarized tunneling in ferromagnet/insulator/ferromagnet junctions", Journal of Magnetism and Magnetic Materials, 151, pp. 403-410 1995. Mentioned on p. 4 of the as-filed translation of the specification as concise explanation of relevance.

(Continued)

*Primary Examiner* — Hoai V Ho
(74) *Attorney, Agent, or Firm* — Chen Yoshimura LLP

(57) ABSTRACT

A magnetic thin film being ferromagnetic and exhibiting large spin polarization at room temperature is provided that comprises a substrate (2) and a $Co_2Fe(Si_{1-x}Al_x)$ thin film (3) formed on the substrate (2) where $0<x<1$ and wherein the $Co_2Fe(Si_{1-x}Al_x)$ thin film (3) has a $L2_1$ or a B2 structure. There may be interposed a buffer layer (4) between the substrate (2) and the $Co_2Fe(Si_{1-x}Al_x)$ thin film (3). A tunneling magnetoresistance effect device and giant magnetoresistance effect device using such a magnetic thin film exhibit large TMR and GMR at room temperature, with low electric current and under low magnetic field. Using such a magnetoresistance effect device, a magnetic device and a magnetic apparatus such as a magnetic sensor, a magnetic head or MRAM are provided.

30 Claims, 19 Drawing Sheets

FOREIGN PATENT DOCUMENTS

| | | |
|---|---|---|
| JP | 2004-524689 A | 8/2004 |
| JP | 2005-051251 A | 2/2005 |
| JP | 2005-116701 A | 4/2005 |
| JP | 2005-228998 A | 8/2005 |

OTHER PUBLICATIONS

Okamura et al., "Large tunnel magnetoresistance at room temperature with a Co2FeAl full-Heusler alloy electrode", Applied Physics Letters, vol. 86, pp. 232503-1-232503-3, 2005. Mentioned on p. 4 of the as-filed translation of the specification as concise explanation of relevance.

Inomata et al., "Structural and magnetic properties and tunnel magnetoresistance for Co2(Cr,Fe) Al and Co2FeSi full-Heusler alloys", Journal of Physics D: Applied Physics, vol. 39, pp. 816-823, 2006. Mentioned on p. 4 of the as-filed translation of the specification as concise explanation of relevance.

Tezuka et al., "Tunnel magnetoresistance for junctions with epitaxial full-Heusler Co2FeAl0.5Si0.5 electrodes with B2 and L21 structures", Applied Physics Letters, 89, 112514, Sep. 14, 2006.

International Search Report (ISR) for PCT/JP2007/059226, citing U.S. Appl. Nos. 1-2 and Foreign Patent Documents Nos. 1-3, and Non-Patent Literature No. 4 indicated above, Aug. 14, 2007.

PCT/ISA/237 in PCT/JP2007/059226 and its English translation of Section V, Aug. 14, 2007.

Translation of PCT/IPEA/409 and IB338 of PCT/JP2007/059226, citing U.S. Appl. Nos. 3 and 4 and Foreign Patent Documents Nos. 4-6 indicated above.

PCT/IPEA/409 in PCT/JP2007/059226, Jun. 25, 2007.

Applicants arguments filed in submitting Article 34 Amendments in PCT/JP2007/059226 and its English language translation, Jun. 25, 2007.

* cited by examiner

MAGNETIC THIN FILM, AND MAGNETORESISTANCE EFFECT DEVICE AND MAGNETIC DEVICE USING THE SAME

TECHNICAL FIELD

The present invention relates to a magnetic thin film that has a large spin polarization and also to a magnetoresistance effect device and a magnetic device using the same.

BACKGROUND ART

In recent years, a giant magnetoresistance (GMR) effect device consisting of a multi-layered film of ferromagnetic layer/nonmagnetic metal layer and a ferromagnetic tunneling junction (MTJ) device comprised of ferromagnetic layer/insulating layer/ferromagnetic layer have been drawing attention as new magnetic field sensors and nonvolatile random access magnetic memory (MRAM) devices. As giant magnetoresistance effect devices there are known those of CIP (Current in Plane) structure in which an electric current is passed in a film plane and those of CPP (Current Perpendicular to the Plane) in which a current is passed in a direction perpendicular to a film plane. Principles of the giant magnetoresistance effect device reside in spin dependent scattering at an interface between a magnetic and a nonmagnetic layer and also in contribution of spin dependent scattering in a magnetic material (bulk scattering). Therefore, in general, the giant magnetoresistance effect device of the CPP structure that is effective in enhancement of the bulk scattering has larger GMR than that of the giant magnetoresistance effect device of CIP structure.

As such giant magnetoresistance effect devices, those of spin valve type in which an antiferromagnetic layer is brought close to one of ferromagnetic layers to pin spin of the ferromagnetic layer have been used. In the case of spin valve type giant magnetoresistance effect devices, since the resistivity of the antiferromagnetic layer is about 200 μΩ·cm or so that is larger by two orders than that of the GMR film, their GMR effect have been weakened. The value of magnetoresistance of the giant magnetoresistance effect device of spin valve type and with CPP structure is as small as 1% or lower. Thus, while giant magnetoresistance effect device of CIP structure have already been practically used in the read head of a hard disk, no giant magnetoresistance effect device of CPP structure has as yet been brought to practical applications. However, if a magnetic material such as a half-metal that has a large spin polarization is developed, its use is expected to bring about large bulk scattering with the result of a large CPP-GMR anticipated.

On the other hand, with a MTJ device in which two ferromagnetic layers are controllably magnetized by an external magnetic field to magnetically orient parallel or antiparallel to each other to obtain at room temperature what is called the tunneling magnetoresistance (TMR) effect in which tunnel currents in directions perpendicular to film plane are different in magnitude from each other (see Non-patent Reference 1). It is known that the TMR effect depends on spin polarization P at an interface between a ferromagnetic and an insulating material used. With the assumption that the spin polarization values of two ferromagnetic materials are $P_1$ and $P_2$, respectively, it is known that TMR is given by equation (1) (Jullier's equation) below.

$$TMR = 2P_1 P_2/(1 - P_1 P_2) \qquad (1)$$

where spin polarization P of a ferromagnetic material takes a value: $0 < P \leq 1$.

If Al oxide film is used as the insulating material constituting a barrier, the maximum value of TMR at room temperature which has been obtained at present is about 60% of that when CoFeB alloy is used.

MTJ devices at present have been put to practical use in magnetic heads for hard disks and in the future are expected of their application to a nonvolatile magnetic random access memory (MRAM). In the MRAM, MTJ devices are arranged in a matrix. A magnetic field is applied to them by flowing an electric current to separately provided wirings so that two magnetic layers constituting each MTJ device are controlled parallel or antiparallel to each other to record "1" or "0". Its readout is performed by utilizing the TMR effect. However, reducing the devices in size to increase the density of the MRAM causes noises to grow due to their non-uniformity, giving rise to the problem that the TMR value is deficient at present. Thus, the need arises to develop a device that exhibits a larger TMR.

As is apparent from equation (1), the use of a magnetic material having P=1 allows expectation that the TMR is infinitely large. A magnetic material satisfying P=1 is termed as a half-metal. So far, from band structure computations, oxides such as $Fe_3O_4$, $CrO_2$, $(La-Sr)MnO_3$, $Th_2MnO_7$ and $Sr_2FeMoO_6$, half-Heusler alloys such as NiMnSb and full-Heusler alloys such as $Co_2MnGe$, $Co_2MnSi$ and $Co_2CrAl$ having $L2_1$ structure are known as half-metals.

Of late, a large TMR of 200% or more at room temperature has been attained using MgO barrier and a ferromagnetic layer of Fe or FeCoB. However, it was utilizing the MgO barrier and special band structures of the above ferromagnetic layer. Such a large TMR was attained only with their particular combination. The spin polarization of the ferromagnetic layer itself is not so large. Indeed, the spin polarization of Fe is around 0.4 and that of FeCoB is about 0.6. Such a large TMR can not be obtained by using Al oxide barrier.

In order to have the $L2_1$ structure with a full-Heusler alloy, it is usually necessary that a substrate be heated to 300° C. or higher, or, after deposition at room temperature, be heat-treated at 300° C. or higher. However, even if the $L2_1$ structure is obtained, there has been no report that a prepared thin film is recognized as a half-metal at room temperature. In fact, any of the tunnel junction devices prepared using such a half-metal materials had unexpectedly low TMRs at room temperature. When Al oxide film was used as a barrier, they were 60 to 70% at the maximum of those of the cases where $Co_2MnAl$ and $Co_2MnSi$ Heusler alloys were used. Moreover, these Heusler alloys containing Mn are liable to be oxidized at an interface and hardly to have a stabilized TMR. Further, due to their liability to oxidation they are large in junction resistance and commonly have a product of resistance and area (RA) amounting to $10^7 \Omega \cdot \mu m^2$ or more. Too high the resistance makes the application to hard disk and mass-storage MRAM difficult.

In practice, it is very difficult to fabricate a thin film of such a half-metal. The causes are considered to include the susceptibility of property of a half-metal to its composition and regularity of its atomic arrangement, especially in a tunnel junction, the difficulty to have the electronic state of a half-metal at its interface, and also the increase in surface roughness and the interface oxidation caused by heating or heat-treating a substrate as necessitated in securing the structure of a half-metal thin film.

The present inventors had fabricated MTJ devices using various full-Heusler alloys in the past. We have reported that when a $Co_2FeAl$ full-Heusler alloy thin film fabricated on a MgO substrate is used, a TMR of 50% or more at room temperature is obtained stably (see Non-patent Reference 2).

It has also discovered that the $Co_2FeAl$ structure then is not of $L2_1$ but B2 in disordered structure and it is difficult to obtain the $L2_1$ structure in this composition.

Meanwhile, it has lately been reported that $Co_2FeSi$ full-Heusler alloy becomes a half-metal. It has been reported by the present inventors that this material has the $L2_1$ structure easily obtained in bulk and the $L2_1$ structure obtained in a thin film as well. However, it is reported by the present inventors in Non-patent Reference 3 that in a tunnel junction using this material, the TMR at room temperature is as low as around 40% and no large TMR as expected from the half-metal is obtained.

Non-patent Reference 1: T. Miyazaki and N. Tezuka "Spin polarized tunneling in ferromagnet/insulator/ferromagnet junctions", J. Magn. Magn. Mater. 151, pp. 403-410, 1995;

Non-patent Reference 2: Okamura et al., Appl. Phys. Lett., Vol. 86, pp. 232503-1 to 232503-3, 2005; and Non-patent Reference 3: Inomata et al., J. Phys. D, Vol. 39, pp. 816-823, 2006

DISCLOSURE OF THE INVENTION

Problems to be Solved by the Invention

While there have so far existed as mentioned above many materials indicated to be half-metals theoretically, none of their prepared thin films has exhibited the half-metal property at room temperature. Thus, there is the problem that such a large TMR as is expected with a half-metal has not been obtained.

In view of the problem mentioned above, the present invention has for its objects to provide a magnetic thin film of large spin polarization with which a TMR that is larger than that of FeCo or FeCoB alloy conventionally obtained at room temperature and a magnetoresistance effect device such as TMR or GMR device and a magnetic device, using such a magnetic thin film, and also to provide a magnetic apparatus such as magnetic head or memory, using the same.

Means for Solving the Problems

Having fabricated a $Co_2Fe(Si_{1-x}Al_x)$ thin film (where $0<x<1$) and a ferromagnetic tunneling junction (MTJ) device and others using the same, the present inventors have discovered that said film is ferromagnetic at room temperature and exhibits a large TMR such as to exceed 70% at room temperature, and are led to accomplish the present invention.

In order to achieve the object mentioned above, there is provided in accordance with the present invention a magnetic thin film characterized in that it comprises a substrate and a $Co_2Fe(Si_{1-x}Al_x)$ thin film formed on the substrate where $0<x<1$ and wherein the $Co_2Fe(Si_{1-x}Al_x)$ thin film has a $L2_1$ or a B2 structure.

In the structure mentioned above, the substrate can be comprised of any one of thermally oxidized Si, glass, MgO single crystal, GaAs single crystal and $Al_2O_3$ single crystal. Preferably a buffer layer is interposed between the substrate and the $Co_2Fe(Si_{1-x}Al_x)$ thin film, the buffer layer being composed of at least one of Cr, Ta, V, Nb, Ru, Fe, FeCo alloy and full-Heusler alloy.

The thin film of $Co_2Fe(Si_{1-x}Al_x)$ (where $0<x<1$) according to the present invention which is ferromagnetic at room temperature can be of a half-metal that is high in spin polarization.

There is also provided in accordance with the present invention a tunneling magnetoresistance effect device characterized in that it comprises a substrate, a ferromagnetic layer constituting a free layer, an insulating layer constituting a tunnel layer and a ferromagnetic layer constituting a pinned layer, in which either of the ferromagnetic layers is comprised of a $Co_2Fe(Si_{1-x}Al_x)$ magnetic thin film (where $0<x<1$) formed on the substrate and having a $L2_1$ or a B2 structure.

Said $Co_2Fe(Si_{1-x}Al_x)$ magnetic thin film (where $0<x<1$) can be used as a free layer. The substrate can be comprised of any one of thermally oxidized Si, glass, MgO single crystal, GaAs single crystal and $Al_2O_3$ single crystal. A buffer layer may be interposed between the substrate and the $Co_2Fe(Si_{1-x}Al_x)$ thin film (where $0<x<1$), the buffer layer being composed of at least one of Cr, Ta, V, Nb, Ru, Fe, FeCo alloy and full-Heusler alloy.

According to the structure mentioned above, a tunneling magnetoresistance effect device can be provided exhibiting large TMR at room temperature, with low current and under low external magnetic field.

There is also provided in accordance with the present invention a giant magnetoresistance effect device characterized in that it comprises a substrate, a ferromagnetic layer constituting a free layer, a nonmagnetic metal layer and a ferromagnetic layer constituting a pinned layer, in which either of the ferromagnetic layers is comprised of a $Co_2Fe(Si_{1-x}Al_x)$ magnetic thin film (where $0<x<1$) formed in a $L2_1$ or a B2 structure on the substrate, the magnetic thin film having an electric current flown through in a direction perpendicular to a film face thereof.

Said $Co_2Fe(Si_{1-x}Al_x)$ magnetic thin film (where $0<x<1$) can be used as a free layer. The substrate can be comprised of any one of thermally oxidized Si, glass, MgO single crystal, GaAs single crystal and $Al_2O_3$ single crystal. A buffer layer may preferably be interposed between the substrate and the $Co_2Fe(Si_{1-x}Al_x)$ thin film (where $0<x<1$), and the buffer layer is composed of at least one of Cr, Ta, V, Nb, Ru, Fe, FeCo alloy and full-Heusler alloy.

According to the structure mentioned above, a giant magnetoresistance effect device can be provided exhibiting large GMR at room temperature, with low current and under low external magnetic field.

The present invention also provides a magnetic device characterized in that it comprises a substrate and a $Co_2Fe(Si_{1-x}Al_x)$ magnetic thin film formed on the substrate where $0<x<1$ and wherein the $Co_2Fe(Si_{1-x}Al_x)$ thin film has a $L2_1$ or a B2 structure.

The magnetic device mentioned above preferably comprises a tunneling magnetoresistance effect device or a giant magnetoresistance effect device having a ferromagnetic layer constituting a free layer, in which the free layer is comprised of the $Co_2Fe(Si_{1-x}Al_x)$ magnetic thin film formed on the substrate (where $0<x<1$). The substrate may be comprised of any one of thermally oxidized Si, glass, MgO single crystal, GaAs single crystal and $Al_2O_3$ single crystal. Between the substrate and the $Co_2Fe(Si_{1-x}Al_x)$ thin film (where $0<x<1$) there may preferably be interposed a buffer layer which is composed of at least one of Cr, Ta, V, Nb, Ru, Fe, FeCo alloy and full-Heusler alloy.

According to the structure mentioned above, a magnetic device can be provided using a magnetoresistance effect device exhibiting large TMR or GMR at room temperature, with low current and under low external magnetic field.

The present invention further provides a magnetic apparatus characterized in that it comprises a substrate and a $Co_2Fe(Si_{1-x}Al_x)$ magnetic thin film formed on the substrate where $0<x<1$ and wherein said $Co_2Fe(Si_{1-x}Al_x)$ thin film has a $L2_1$ or a B2 structure.

The magnetic apparatus mentioned above preferably comprises a tunneling magnetoresistance effect device or a giant magnetoresistance effect device having a ferromagnetic layer constituting a free layer, in which the free layer is comprised of the $Co_2Fe(Si_{1-x}Al_x)$ magnetic thin film formed on the substrate (where $0<x<1$). The substrate may be comprised of any one of thermally oxidized Si, glass, MgO single crystal, GaAs single crystal and $Al_2O_3$ single crystal. Between the substrate and the $Co_2Fe(Si_{1-x}Al_x)$ thin film (where $0<x<1$) there may preferably be interposed a buffer layer which is composed of at least one of Cr, Ta, V, Nb, Ru, Fe, FeCo alloy and full-Heusler alloy. Preferably the magnetic apparatus is one of apparatuses of the class that consists of a magnetic sensor, a hard disk driver (HDD) with a magnetic head, and an MRAM.

Using a magnetoresistance effect device exhibiting large TMR or GMR at room temperature, with low electric current and under low external magnetic field in accordance with the above-mentioned structure, a variety of magnetic apparatus can be provided such as a MRAM with a large capacity, a HDD with high density and sensor with a high sensitivity.

Effects of the Invention

As will be appreciated from the foregoing description, a magnetic thin film using $Co_2Fe(Si_{1-x}Al_x)$ (where $0<x<1$) having $L2_1$ or B2 structure of the present invention exhibits ferromagnetic properties and has a large spin polarization.

A giant magnetoresistance effect device using a $Co_2Fe(Si_{1-x}Al_x)$ (where $0<x<1$) magnetic thin film having $L2_1$ or B2 structure of the present invention allows an extremely large GMR to be attained at room temperature, with low electric current and under low external magnetic field. A tunneling magnetoresistance effect device likewise allows having a very large TMR.

If a magnetoresistance effect device of every kind that uses a magnetic thin film of $Co_2Fe(Si_{1-x}Al_x)$ (where $0<x<1$) having $L2_1$ or B2 structure of the present invention is applied to a variety of magnetic apparatus including a magnetic head of ultra-high density HDD and a nonvolatile and high-speed operating MRAM, it is then possible to realize a magnetic apparatus of small size and high performance. It can be applied also for a spin injection device that requires small in saturation magnetization and large in spin polarization whereby magnetization reversal current by spin injection can be reduced. In addition to the possibility thus to achieve magnetization reversal with a reduced power consumption, it is possible to implement effective spin injection into a semiconductor, leading to the likelihood of a spin-FET being developed. As such, a magnetic thin film according to the present invention can be utilized as a key material to develop a new field of spin electronics.

DESCRIPTION OF REFERENCE CHARACTERS

Figure 1:
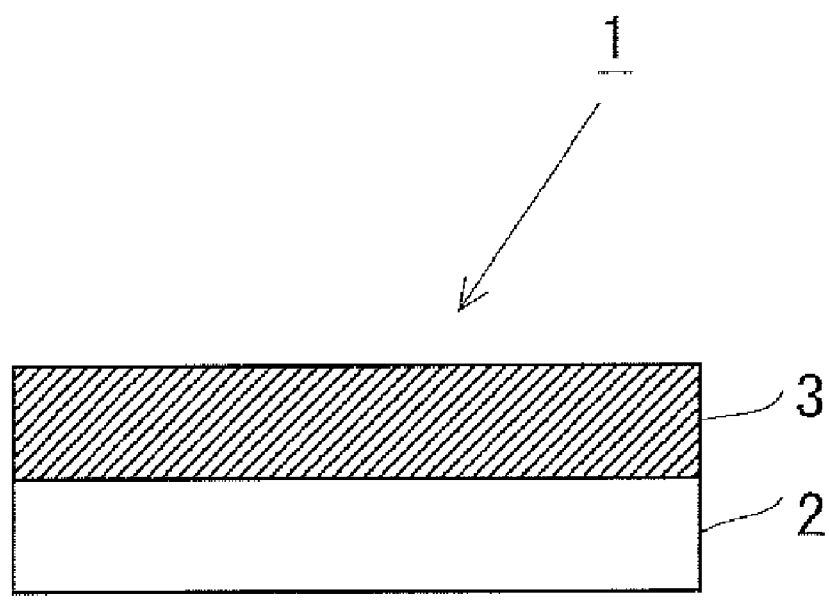
FIG. 1 is a cross sectional view of a magnetic thin film according to a first form of implementation of the present invention.

| | |
|---|---|
| 1, 5: | Magnetic thin film |
| 2: | Substrate |
| 3, 16 | $Co_2Fe(Si_{1-x}Al_x)$ thin film |
| 4: | Buffer layer |
| 10, 15, 20: | Tunneling magnetoresistance effect device |
| 11: | Insulating layer |
| 12, 22: | Ferromagnetic layer |
| 13: | Antiferromagnetic layer |
| 14: | Electrode layer |
| 21: | Nonmagnetic metal layer |
| 30, 35: | Giant magnetoresistance effect device |

BEST MODES FOR CARRYING OUT THE INVENTION

An explanation will hereinafter be given in detail of the present invention with reference to forms of implementation thereof shown in the Drawing Figures in which like reference characters are used to designate like or corresponding components.

At first, a first form of implementation of magnetic thin film according to the present invention will be shown.

FIG. 1 is a cross sectional view of a magnetic thin film according to the first form of implementation of the present invention. In a magnetic thin film 1 of the present invention as shown in FIG. 1, a thin film 3 of $Co_2Fe(Si_{1-x}Al_x)$ having $L2_1$ or B2 structure is disposed on a substrate 2. Here, composition x is $0<x<1$. The $Co_2Fe(Si_{1-x}Al_x)$ thin film 3 is ferromagnetic at room temperature. The $Co_2Fe(Si_{1-x}Al_x)$ thin film 3 on the substrate 2 may have a film thickness of not less than 1 nm and not greater than 1 µm.

Figure 2:
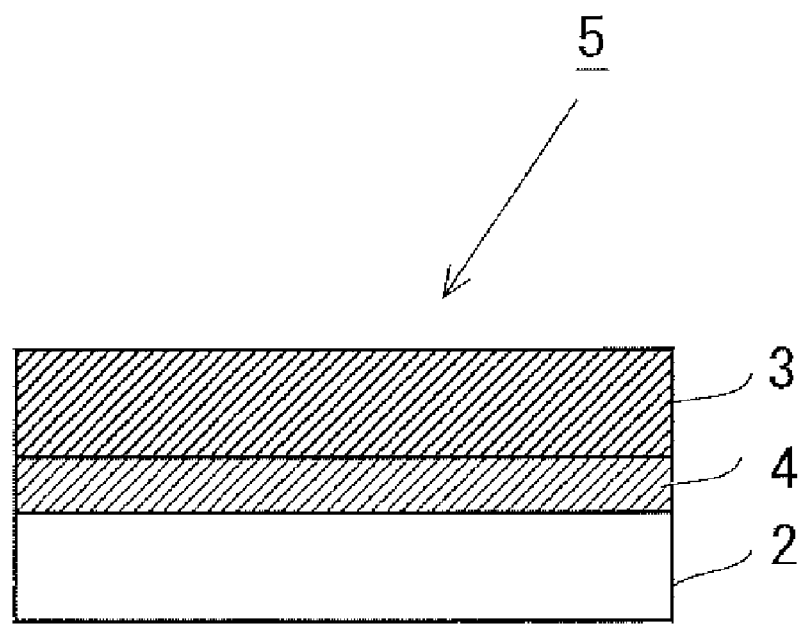
FIG. 2 is a cross sectional view of a modification of the magnetic thin film according to the first form of implementation.

FIG. 2 is a cross sectional view of a modified magnetic thin film according to the first form of implementation of the present invention. As shown in FIG. 2, the magnetic thin film 3 of the present invention in the structure of the magnetic thin film 1 of FIG. 1 further has a buffer layer 4 interposed between the substrate 2 and the thin film 3 of $Co_2Fe(Si_{1-x}Al_x)$ (where $0<x<1$). Interposing the buffer layer 4 can further improve the crystal quality of the thin film 3 of $Co_2Fe(Si_{1-x}Al_x)$ (where $0<x<1$) on the substrate 1 and reduce its surface roughness.

The substrate 2 used in the magnetic thin film 1, 5 may be of polycrystal of such as thermally oxidized Si or glass or single crystal of such as MgO, $Al_2O_3$ or GaAs. As the buffer layer 4, a body-centered cubic crystalline metal such as Cr, V, Nb, Ta, Fe or FeCo alloy or a full-Heusler alloy may be used. Providing the buffer layer 4 on the substrate 2 allows fabricating the thin film 3 of $Co_2Fe(Si_{1-x}Al_x)$ (where $0<x<1$) having $L2_1$ or B2 structure that is of smooth surface and better crystal quality.

The film thickness of the thin film 3 of $Co_2Fe(Si_{1-x}Al_x)$ (where $0<x<1$) may be not less than 1 nm and not more than 1 µm. When the film thickness is less than 1 nm and when the film thickness exceeds 1 µm, then it undesirably becomes difficult to practically obtain the $L2_1$ or B2 structure as described later and to be applied as a spin device, respectively.

Next, the function of the magnetic thin film of first form of implementation 1 so constructed as mentioned above will be explained.

Figure 3:
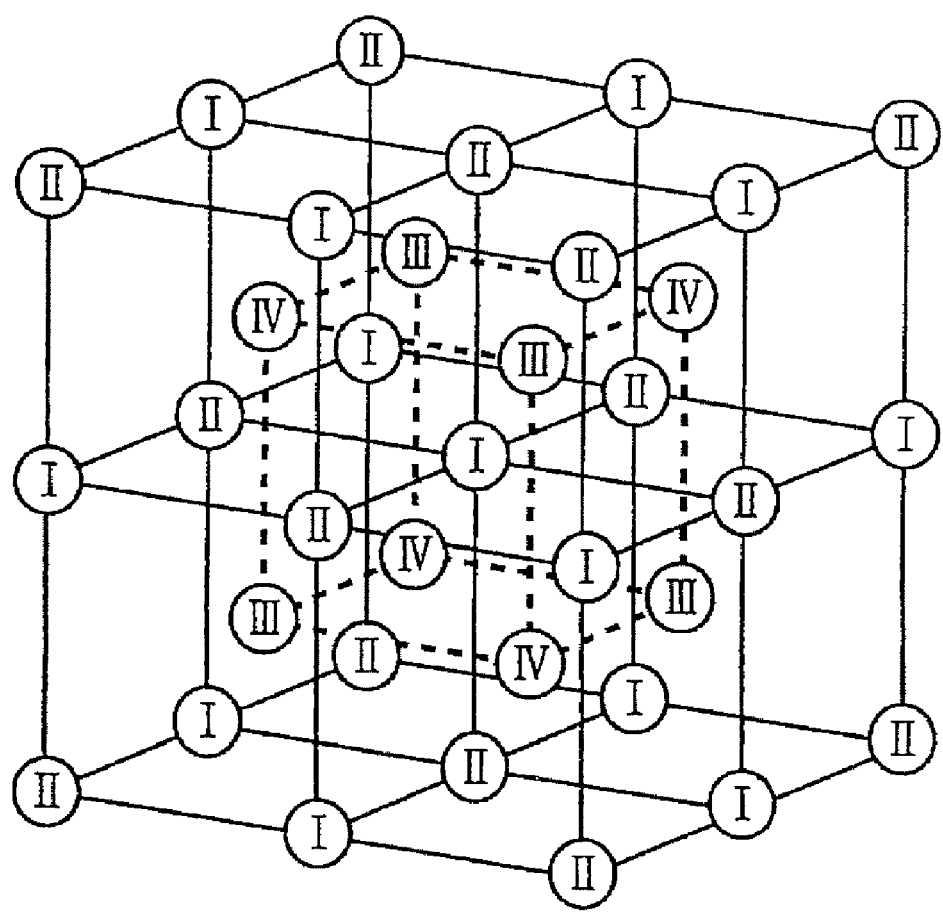
FIG. 3 is a diagrammatic explanatory view of a structure of $Co_2Fe(Si_{1-x}Al_x)$ (where $0<x<1$) used in the magnetic thin film according to the first form of implementation.

FIG. 3 is an explanatory view diagrammatically illustrating a structure of $Co_2Fe(Si_{1-x}Al_x)$ (where $0<x<1$) used in the magnetic thin film according to the first form of implementation of the present invention. The structure as shown is octuple (twice in lattice constant) of a conventional unit cell of bcc (body centered cubic lattice) structure.

In the $L2_1$ structure of $Co_2Fe(Si_{1-x}Al_x)$, Si and Al atoms are arranged at positions I in FIG. 3 so that their composition ratio meets $Si_{1-x}Al_x$ (where $0<x<1$), and Fe atoms are arranged at positions II and Co atoms at positions III and IV.

Further, the B2 structure of $Co_2Fe(Si_{1-x}Al_x)$ is that in which Fe, Si and Al atoms are arranged irregularly at positions I and II in FIG. 3. Then, Si and Al atoms are arranged so that their composition ratio meets $Si_{1-x}Al_x$ (where $0<x<1$).

Next, the magnetic property of the magnetic thin film 1, 5 constructed as above according to the form of implementation 1 will be explained.

The thin film 3 of $Co_2Fe(Si_{1-x}Al_x)$ constructed as above is ferromagnetic at room temperature and it is obtained as the thin film 3 of $Co_2Fe(Si_{1-x}Al_x)$ (where $0<x<1$) of $L2_1$ or B2 structure. If a thin film 3 of $Co_2Fe(Si_{1-x}Al_x)$ (where $0<x<1$) is deposited on a heated substrate 2 or the thin film deposited is heat-treated, there results either $L2_1$ or B2 structure depending on the heating temperature. The composition x of $Co_2Fe(Si_{1-x}Al_x)$ thin film 3 was conditioned to be $0<x<1$ because $x=0$ or 1 does not yield large TMR or GMR in tunneling magnetoresistance effect devices or giant magnetoresistance effect devices of CPP structure.

The B2 and $L2_1$ structures of $Co_2Fe(Si_{1-x}Al_x)$ (where $0<x<1$) are similar, but differ from each other in that in the $L2_1$ structure, Si (Al) and Fe atoms are regularly arranged and in the B2 structure they are irregularly arranged. These differences can be measured by X-ray diffraction.

Next, a second form of implementation of the present invention on a magnetoresistance effect device using a magnetic thin film will be shown.

Figure 4:
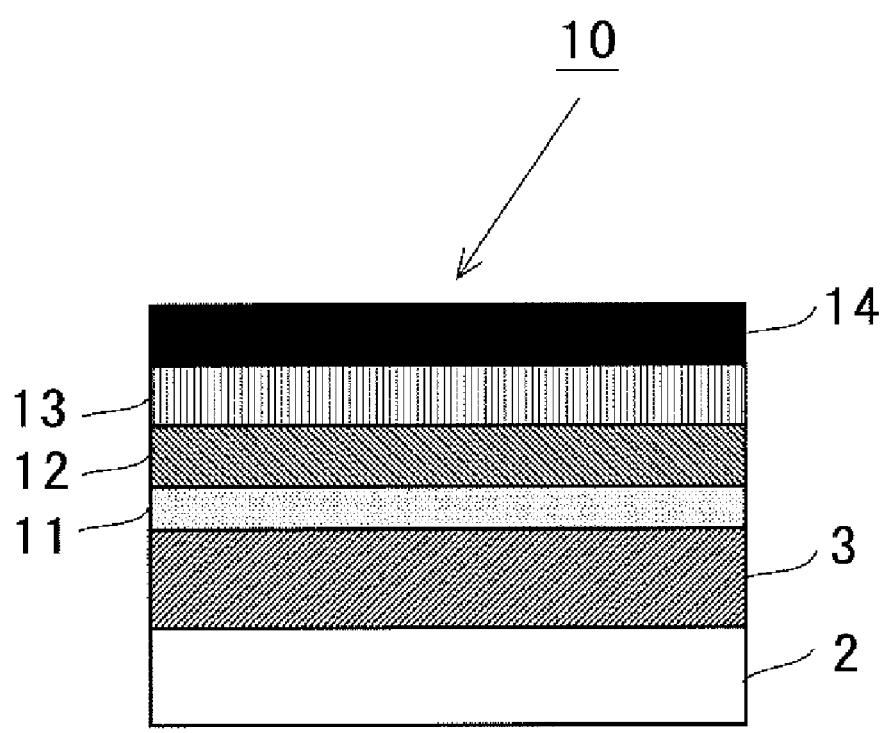
FIG. 4 is a view illustrating the cross section of a magnetoresistance effect device using a magnetic thin film according to a second form of implementation.

FIG. 4 is a view illustrating the cross section of a magnetoresistance effect device using a magnetic thin film in accordance with the second form of implementation of the present invention. The magnetoresistance effect device using a magnetic thin film in accordance with the present invention is shown as a tunneling magnetoresistance effect device. As shown in FIG. 4, the tunneling magnetoresistance effect device 10 has a thin film 3 of $Co_2Fe(Si_{1-x}Al_x)$ (where $0<x<1$) disposed, e.g., on a substrate 2 and has the structure that an insulating layer 11 constituting a tunnel barrier, a ferromagnetic layer 12 and an antiferromagnetic layer 13 are deposited successively in this order thereon.

Here, the antiferromagnetic layer 13 is used for the sake of a structure of what is called spin valve type, for pinning spins of the ferromagnetic layer 12. In this structure, the thin film 3 of $Co_2Fe(Si_{1-x}Al_x)$ (where $0<x<1$) is referred to as a free layer and the ferromagnetic layer 12 as a pinned layer. Note also that the ferromagnetic layer 12 may be a monolayer or multilayer structure. The insulator layer 11 may be composed of $Al_2O_3$, $AlO_x$ as an Al oxide or MgO. The ferromagnetic layer 12 may be a CoFe, NiFe or CoFeB layer or a composite layer of CoFe and NiFe. The antiferromagnetic layer 13 may be composed of IrMn or the like. Furthermore, it is preferred that the antiferromagnetic layer 13 in the tunneling magnetoresistance effect device 10 has an electrode layer 14 formed thereon, constituting a protective layer.

Figure 5:
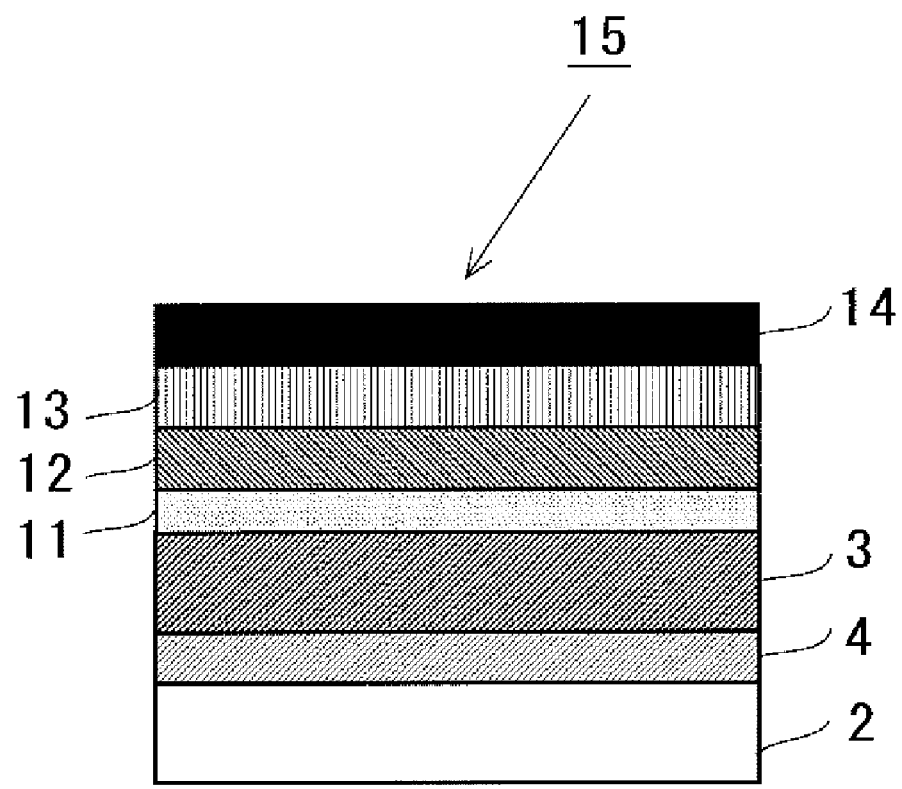
FIG. 5 is a view illustrating the cross section of a modification of the magnetoresistance effect device using the magnetic thin film according to the second form of implementation.

FIG. 5 is a view illustrating the cross section of a modification of the magnetoresistance effect device using a magnetic thin film in accordance with the second form of implementation of the present invention. A tunneling magnetoresistance effect device 15 as a magnetoresistance effect device using a magnetic thin film in accordance with the present invention has a buffer layer 4 and a thin film 3 of $Co_2Fe(Si_{1-x}Al_x)$ (where $0<x<1$) disposed on a substrate 2 and has the structure that an insulating layer 11 constituting a tunnel barrier, a ferromagnetic layer 12 constituting a pinned layer, an antiferromagnetic layer 13 and a nonmagnetic electrode layer 14 as a protective layer are deposited successively in this order. The structure of FIG. 5 is identical to that of FIG. 4 except that the buffer layer 4 is arranged in addition to the structure of FIG. 4.

Figure 6:
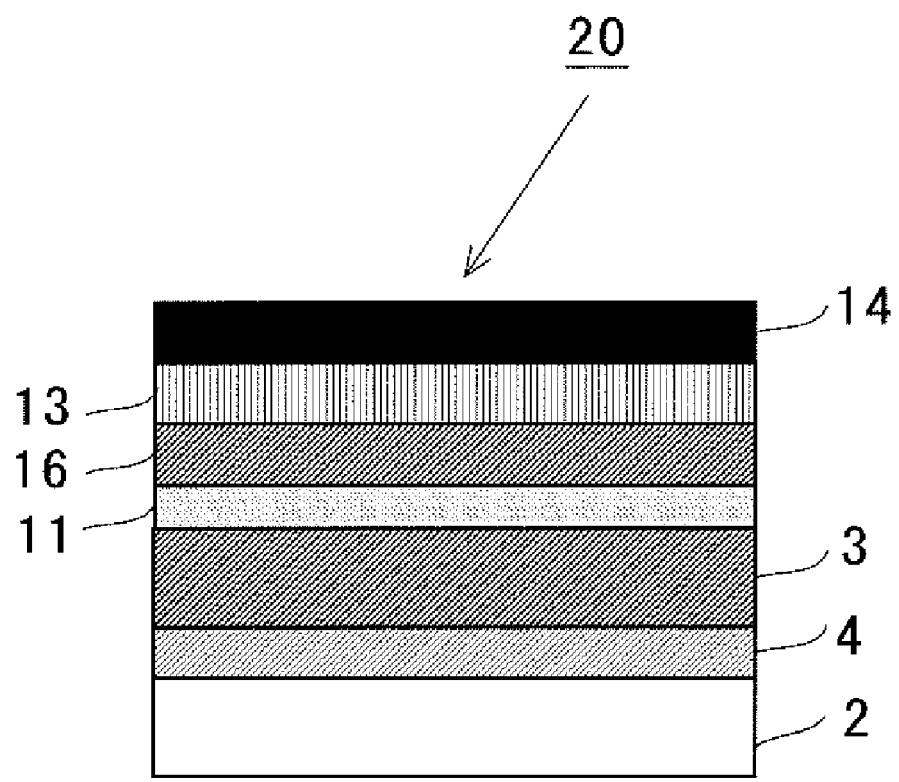
FIG. 6 is a view illustrating the cross section of an alternative modification of the magnetoresistance effect device using the magnetic thin film according to the second form of implementation.

FIG. 6 is a view illustrating the cross section of an alternative modification of the magnetoresistance effect device using the magnetic thin film in accordance with the second form of implementation of the present invention. A tunneling magnetoresistance effect device 20 as the magnetoresistance effect device using the magnetic thin film in accordance with the present invention has the buffer layer 4 and the thin film 3 of $Co_2Fe(Si_{1-x}Al_x)$ (where $0<x<1$) disposed on the substrate 2 and has the structure that the insulating layer 11 constituting the tunnel barrier, a thin film 16 of $Co_2Fe(Si_{1-x}Al_x)$ (where $0<x<1$), the antiferromagnetic layer 13 and the nonmagnetic electrode layer 14 as the protective layer are deposited successively in this order. The structure of FIG. 6 is identical to that of FIG. 5 except that the thin film 16 of $Co_2Fe(Si_{1-x}Al_x)$ (where 0<x<1) as the thin film of the present invention is used for the ferromagnetic layer 12 constituting the pinned layer in FIG. 5.

Note that the ferromagnetic layer 16 as the pinned layer may be a multi-layered film comprised of a thin film of $Co_2Fe(Si_{1-x}Al_x)$ (where 0<x<1) and a ferromagnetic layer such as of CoFe.

A voltage when applied to the tunneling magnetoresistance effect device 10, 15, 20 is applied between the thin film 3 of $Co_2Fe(Si_{1-x}Al_x)$ (where 0<x<1) or the buffer layer 4 and the electrode layer 14. Also, an external magnetic field is applied inside of and parallel to film planes. The way to flow an electric current to the buffer layer 4 and the electrode layer 14 can be to pass the electric current in a direction perpendicular to the film planes in a CPP structure.

Here, the substrate 2 used in the tunneling magnetoresistance effect device 10, 15, 20 may be of polycrystal such as of thermally oxidized Si or glass or single crystal such as of MgO, $Al_2O_3$ or GaAs. Also, the buffer layer 4 used may be composed of at least one of Cr, Ta, V, Nb, Ru, Fe, a FeCo alloy or a full-Heusler alloy. The thin film 3 of $Co_2Fe(Si_{1-x}Al_x)$ (where 0<x<1) may have a film thickness not less than 1 nm and not more than 1 μm. If the film thickness is less than 1 nm and if the film thickness exceeds 1 μm, then it undesirably becomes difficult to practically obtain the $L2_1$ or B2 structure and to be applied as a tunneling magnetoresistance effect device, respectively.

A tunneling magnetoresistance effect device 10, 15, 20 of the present invention so constructed as mentioned above may be manufactured using a conventional thin film deposition process such as sputtering, vapor deposition, laser ablation or MBE method and a masking process etc. for forming such as an electrode of a given shape.

Next, the operation of the tunneling magnetoresistance effect device 10, 15 as a magnetoresistance effect device using the magnetic thin film of the present invention will be explained.

In the magnetoresistance effect device 10, 15 using the magnetic thin film of the present invention in which the two ferromagnetic layers 3 and 12 are used. As the spin valve type, spins in one of them 12 (pinned layer) are pinned by the adjacent antiferromagnetic layer 13. When an external magnetic field is applied, spins only in the thin film 3 of $Co_2Fe(Si_{1-x}Al_x)$ (where 0<x<1) constituting the other ferromagnetic free layer are inverted.

The ferromagnetic layer 12 is thus magnetized by exchange interaction with the antiferromagnetic layer 13, pinning spins in one direction. Therefore, spins of the thin film 3 of $Co_2Fe(Si_{1-x}Al_x)$ (where 0<x<1) as the free layer are readily made parallel or antiparallel. As the thin film 3 of $Co_2Fe(Si_{1-x}Al_x)$ (where 0<x<1) constituting the ferromagnetic layer has a spin polarization as large as 0.5 or more at room temperature, the TMR of the tunneling magnetoresistance effect device 10, 15 of the present invention becomes extremely large. Since the thin film 3 of $Co_2Fe(Si_{1-x}Al_x)$ (where 0<x<1) as the free layer is then small in magnetization, its demagnetizing field may correspondingly be small, permitting its magnetization to be inverted under small magnetic field. Thus, the tunneling magnetoresistance effect device 10, 15 of the present invention is made well suitable for a magnetic device such as MRAM requiring its magnetization reversal with low electric power.

Next, the operation of the tunneling magnetoresistance effect device 20 as a magnetoresistance effect device using the magnetic thin film of the present invention will be explained.

Since in a tunneling magnetoresistance effect device 20, the ferromagnetic layer 16 as the pinned layer is also formed of $Co_2Fe(Si_{1-x}Al_x)$ (where 0<x<1) having large spin polarization, identically forming the thin film 3 of $Co_2Fe(Si_{1-x}Al_x)$ (where 0<x<1) as the pinned layer and which thus makes the denominator yet smaller in equation (1) shown above. Thus, the tunneling magnetoresistance effect device 20 makes the denominator yet smaller in equation (1) shown above, the TMR of the tunneling magnetoresistance effect device becomes still larger. Thus, the tunneling magnetoresistance effect device 20 of the present invention is made well suitable for a magnetic device such as MRAM requiring large TMR.

Next, a third form of implementation on the magnetoresistance effect device using the magnetic thin film of the present invention will be shown.

Figure 7:
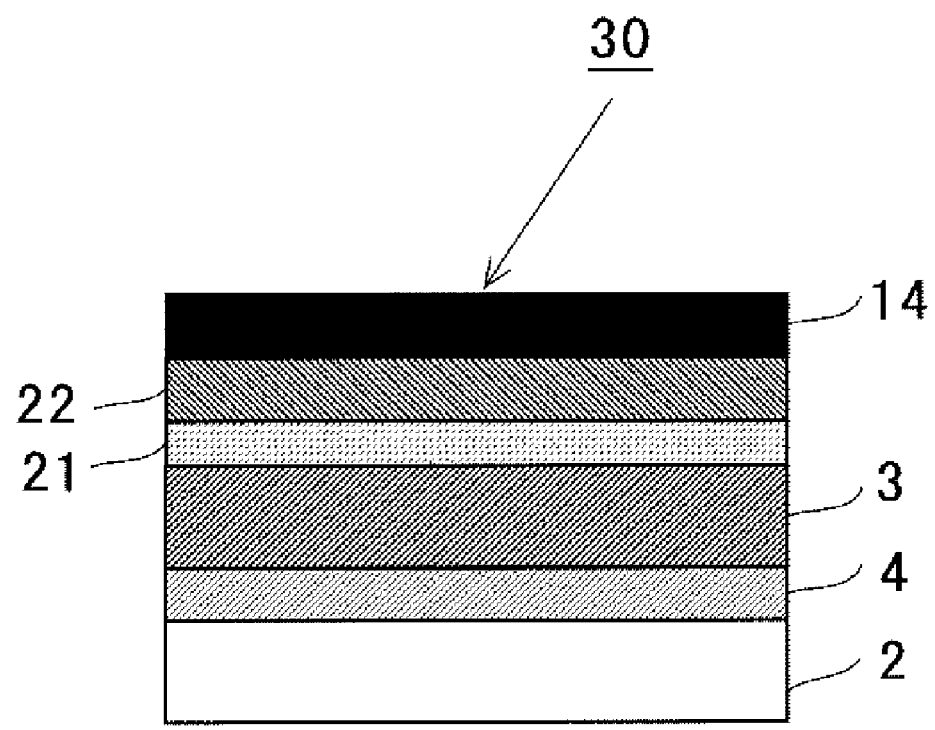
FIG. 7 is a view illustrating the cross section of a magnetoresistance effect device using a magnetic thin film according to a third form of implementation.

FIG. 7 is a view illustrating the cross section of a magnetoresistance effect device using a magnetic thin film in accordance with the third form of implementation of the present invention. The magnetoresistance effect device using a magnetic thin film in accordance with the present invention is shown as a giant magnetoresistance effect device. As shown in the Figure, the giant magnetoresistance effect device 30 has a buffer layer 4 and a thin film 3 of $Co_2Fe(Si_{1-x}Al_x)$ (where 0<x<1) disposed as a free layer constituting a ferromagnetic body on a substrate 2 and has the structure that a nonmagnetic metal layer 21, a ferromagnetic layer 22 as a pinned layer and a nonmagnetic electrode layer 14 as a protective layer are deposited successively in this order thereon.

Here, the giant magnetoresistance effect device has a voltage applied between the buffer layer 4 and the electrode layer 14 for CPP structure. Also, an external magnetic field is applied inside of and parallel to film planes. The way to flow an electric current to the buffer layer 4 and the electrode layer 14 can be to pass the electric current in a direction perpendicular to the film planes in a CPP structure, while an electric current flows inside of the film planes in a CIP structure for applied voltage in an electrode layer.

Figure 8:
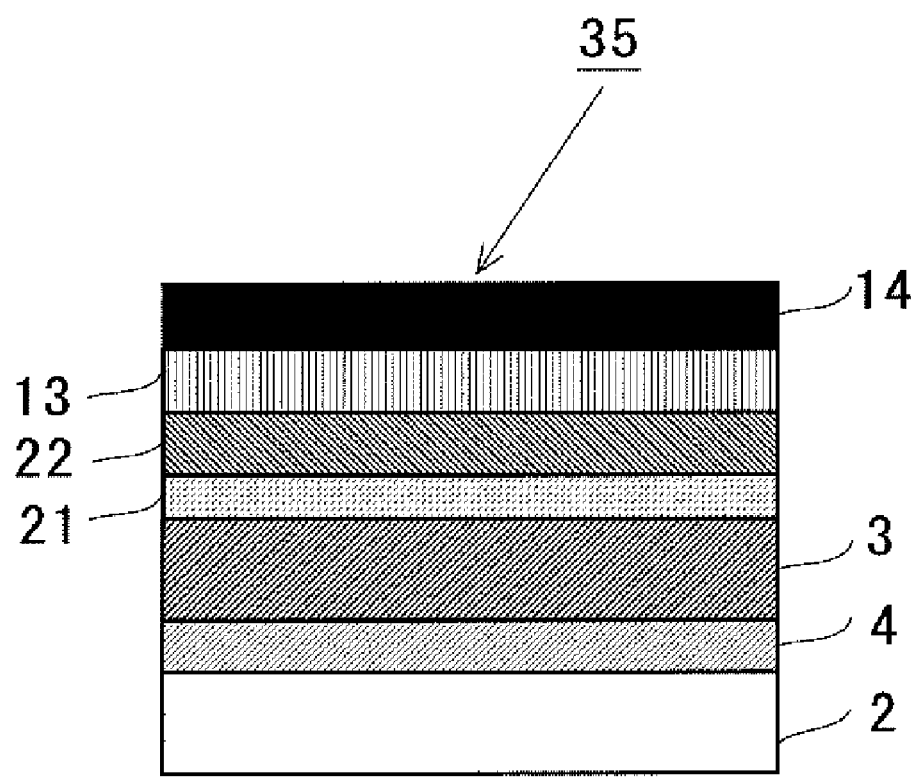
FIG. 8 is a view illustrating the cross section of a modification of the magnetoresistance effect device using the magnetic thin film according to the third form of implementation.

FIG. 8 is a view illustrating the cross section of a modified giant magnetoresistance effect device using the magnetic thin film according to the third form of implementation of the present invention. The giant magnetoresistance effect device 35 here is identical to the giant magnetoresistance effect device 30 in FIG. 7 except that an antiferromagnetic layer 13 is disposed between the ferromagnetic layer 22 and the electrode layer 14 to provide a giant magnetoresistance effect device of spin valve type. Repeated description of the other structural details that are identical to those in FIG. 7 is omitted.

The antiferromagnetic layer 13 acts to pin spins of the adjacent ferromagnetic layer 22 constituting the pinned layer. Here, the giant magnetoresistance effect device 30, 35 has a voltage applied between the buffer layer 4 and the electrode layer 14. Also, an external magnetic field is applied inside of and parallel to film planes. The way to flow an electric current to the buffer layer 4 and the electrode layer 14 can be to pass in a direction perpendicular to the film planes in a CPP structure, while an electric current flows inside of the film planes in a CIP structure for applied voltage in an electrode layer.

The substrate 2 used in the giant magnetoresistance effect device 30, 35 may be of polycrystal such as of thermally oxidized Si or glass or single crystal such as of MgO, $Al_2O_3$ or GaAs. Also, The buffer layer 4 used may be composed of at least one of Cr, Ta, V, Nb, Ru, Fe, a FeCo alloy or a full-Heusler alloy. The nonmagnetic metal layer 21 used may be of Cu, Al, Cr or the like. Also, the ferromagnetic layer 22 used may be a film of any one of such as CoFe, NiFe and $Co_2Fe(Si_{1-x}Al_x)$ (where 0<x<1), or a composite film consisting of such materials. And, IrMn, PtMn or the like may be used for the antiferromagnetic layer 13.

The thin film 3 of $Co_2Fe(Si_{1-x}Al_x)$ (where $0<x<1$) may have a film thickness not less than 1 nm and not more than 1 µm. If the film thickness is less than 1 nm and if the film thickness exceeds 1 µm, then it undesirably becomes difficult to practically obtain the $L2_1$ or B2 structure and to apply as a giant magnetoresistance effect device, respectively.

The giant magnetoresistance effect device 30, 35 of the present invention so constructed as mentioned above may be manufactured using a thin film deposition process such as sputtering, vapor deposition, laser ablation or MBE method and a masking process for forming such as an electrode of a given shape.

Next, an operation of the giant magnetoresistance effect device 30 as a magnetoresistance effect device using the magnetic thin film of the present invention will be explained. The thin film 3 of $Co_2Fe(Si_{1-x}Al_x)$ (where $0<x<1$) as a ferromagnetic layer being a half-metal, there results an extremely large magnet resistance or GMR since it is only spins in one direction of the thin film 3 of $Co_2Fe(Si_{1-x}Al_x)$ (where $0<x<1$) that contribute conduction when an external magnetic field is applied.

Next, an operation of the giant magnetoresistance effect device 35 as a magnetoresistance effect device using the magnetic thin film of the present invention will be explained. In this case, the giant magnetoresistance effect device 35 is the spin valve type. The spins in the ferromagnetic pinned layer 22 are pinned by the antiferromagnetic layer 13. When an external magnetic field is applied, spins in the thin film 3 of $Co_2Fe(Si_{1-x}Al_x)$ (where $0<x<1$) as the free layer are made parallel and antiparallel by the external magnetic field. Further, because it is only spins in one direction of the thin film 3 of $Co_2Fe(Si_{1-x}Al_x)$ (where $0<x<1$) that contribute conduction, there results an extremely large GMR.

Next, a CPP operation of the giant magnetoresistance effect device 30, 35 as a magnetoresistance effect device using the magnetic thin film of the present invention will be explained. In the giant magnetoresistance effect device of CPP structure in which the resistivity of $Co_2Fe(Si_{1-x}Al_x)$ (where $0<x<1$) is equal to or more than that of the antiferromagnetic layer 13, there is little drop in GMR due to the presence of the antiferromagnetic layer 13 and results large CPP-GMR.

Next, a fourth form of the implementation on a magnetic apparatus using a magnetoresistance effect device with a magnetic thin film of the present invention will be shown.

As shown in FIGS. 1 to 8, a magnetoresistance effect device of every kind using a magnetic thin film of the present invention has an extremely large TMR or GMR with a low electric current and under a low magnetic field at room temperature. In this case, the ratio of resistance change when an external magnetic field is applied is given by equation (2) below. The greater the given value, which acts as GMR or TMR effect, is the more desirable.

Ratio of resistance change=(Maximum resistance–
    Minimum resistance)/(Minimum. resistance) (%)     (2)

The equation indicates that a magnetoresistance effect device using a magnetic thin film of the present invention gives rise to a large ratio of resistance change when a magnetic field is applied which is very slightly larger than zero, namely a low magnetic field.

Exhibiting large TMR or GMR at room temperature, with low current and under low magnetic field, a magnetoresistance effect device using a magnetic thin film of the present invention can be used as a magnetoresistance sensor with high sensitivity. A tunneling magnetoresistance effect device or giant magnetoresistance effect device using a magnetic thin film of the present invention can be applied to a variety of magnetic devices.

Exhibiting large TMR or GMR at room temperature, with low current and under low magnetic field, a magnetoresistance effect device using a magnetic thin film of the present invention can also be used to form a highly sensitive readout magnetic head for HDD.

Also, a magnetoresistance effect device using a magnetic thin film of the present invention can be used, e.g. as a MTJ device, in a variety of magnetic apparatus such as a MRAM. The MRAM has MTJ devices arranged in a matrix, and has external magnetic field applied to them by flowing electric current to wirings separately provided. Magnetization of the ferromagnet constituting the free layer in each MTJ device is thereby controlled to make spins therein mutually parallel and antiparallel by the external magnetic field and thus to record "1" and "0". Further, its readout is performed by utilizing the TMR effect.

Also, MTJ devices of CPP structure as magnetoresistance effect device of the present invention can be reduced in device area to permit increasing the storage capacity of a magnetic apparatus such as MRAM or hard disk drive (HDD). Note that the term "magnetic apparatus" is used to include a magnetic head, a magnetic recorder of every kind using a magnetic head, including a MRAM and a hard disk drive as mentioned above.

EXAMPLE 1

Specific examples of the present invention will be explained below.

With the use of a high-frequency magnetron sputtering system, a thin film 3 of $Co_2Fe(Si_{0.5}Al_{0.5})$ having a thickness of 100 nm was fabricated on a substrate 2 of MgO (001) and thereafter was heat-treated at a temperature up to 600° C. maximum.

Figure 9:
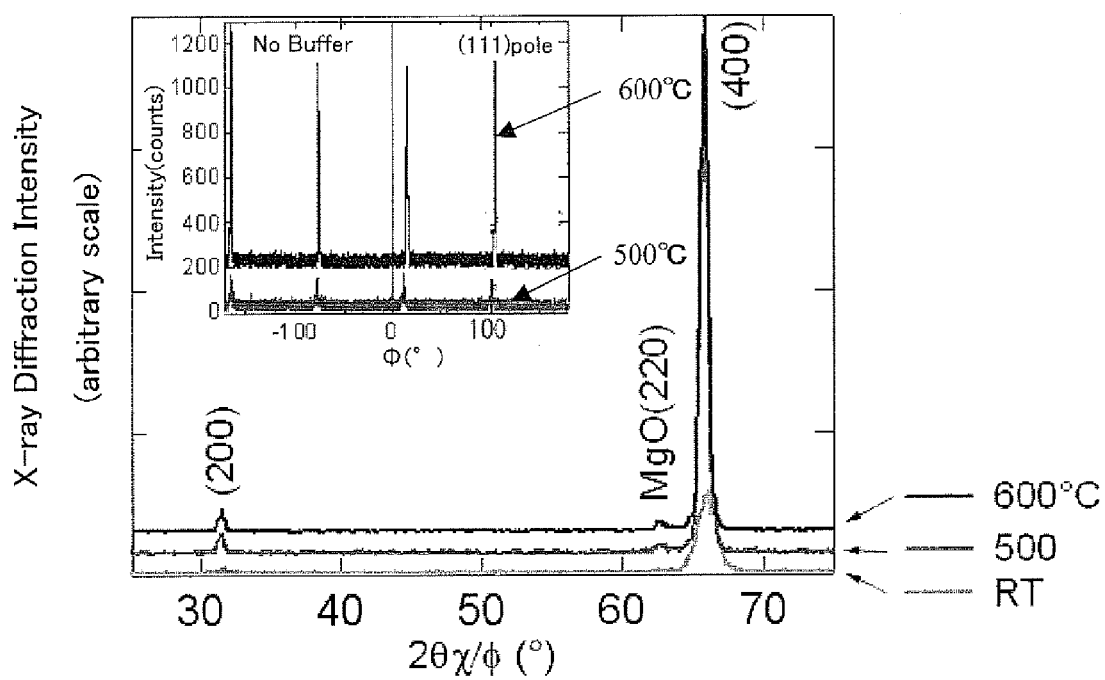
FIG. 9 is a graph illustrating results of measurement on X-ray diffraction of a $Co_2Fe(Si_{0.5}Al_{0.5})$ thin film of Example 1.

FIG. 9 illustrates results of measurement on X-ray diffraction of the $Co_2Fe(Si_{0.5}Al_{0.5})$ thin film 3 of Example 1. In FIG. 9, the ordinate axis represents the X-ray diffraction intensity (in arbitrary scale) and the abscissa axis represents the angle (in °), namely an angle corresponding to twice the angle of incidence θ of the X-ray on the atomic plane. FIG. 9 indicates a specimen having the $Co_2Fe(Si_{0.5}Al_{0.5})$ thin film 3 deposited at room temperature and specimens having the depositions and then heat-treated at 500° C. and 600° C., respectively. As is apparent from FIG. 9, it is seen that the $Co_2Fe(Si_{0.5}Al_{0.5})$ thin film 3 has a (001) orientation and is epitaxially grown on the MgO substrate 2 on rotation of 45° in the film plane.

The inserted graph in FIG. 9 illustrates X-ray diffraction patterns of the specimens having the $Co_2Fe(Si_{0.5}Al_{0.5})$ thin films 3 formed at room temperature and then heat-treated at 500° C. and 600° C. It shows the X-ray diffraction patterns in the case where the angle is set at the (111) diffraction line corresponding to the ordered phase of $L2_1$ structure and then changed by rotation in the film plane. It has been found that this film has an $L2_1$ structure from the observed tetragonal diffraction pattern.

On the other hand, in the case of the $Co_2Fe(Si_{0.5}Al_{0.5})$ thin film 3 not heat-treated (not shown), the (111) diffraction pattern was not observed and the film was found to be of a B2 structure. Thus, it has been found that the $Co_2Fe(Si_{0.5}Al_{0.5})$ thin film 3 fabricated on the MgO substrate 2 in Example 1 has the B2 or $L2_1$ structure depending on a suitable temperature of heat treatment.

EXAMPLE 2

A $Co_2Fe(Si_{0.5}Al_{0.5})$ thin films 3 of 100 nm thickness was fabricated in the same manner as in Example 1 except the use of a buffer layer 4 consisting of Cr. Afterwards it was heat-treated at temperature up to 600° C. maximum.

Figure 10:
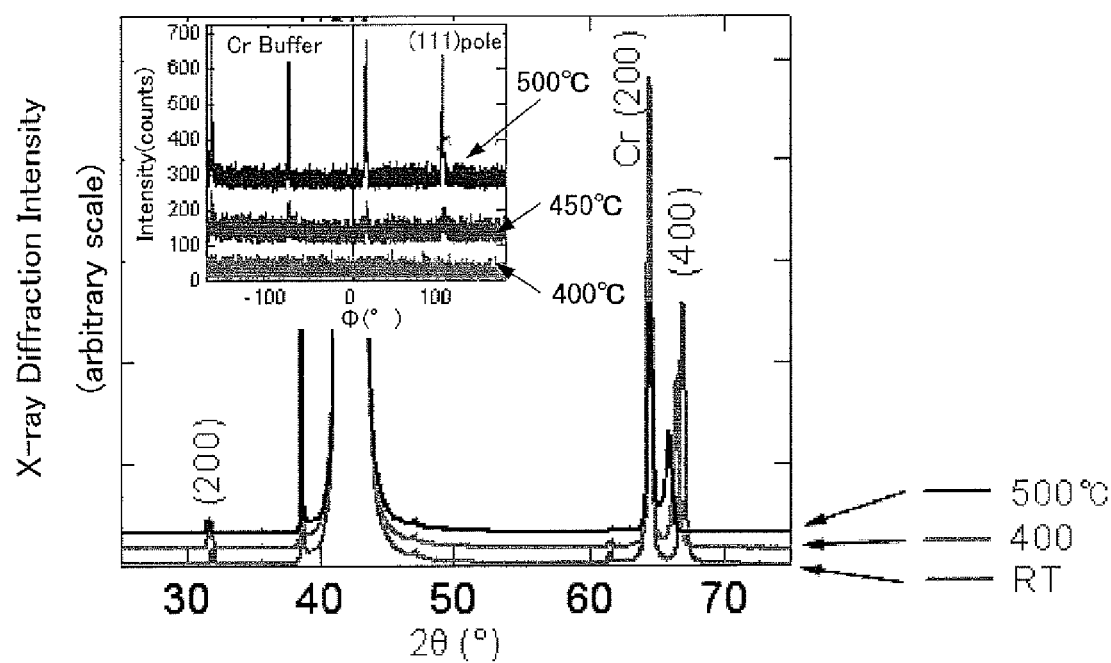
FIG. 10 is a graph illustrating results of measurement on X-ray diffraction of a $Co_2Fe(Si_{0.5}Al_{0.5})$ thin film of Example 2.

FIG. 10 illustrates results of measurement on X-ray diffraction of the $Co_2Fe(Si_{0.5}Al_{0.5})$ thin film 3 of Example 2. The ordinate and the abscissa axes are same as in FIG. 9. FIG. 10 indicates a specimen having the $Co_2Fe(Si_{0.5}Al_{0.5})$ thin film 3 deposited at room temperature and specimens having the depositions and then heat-treated at 400° C. and 500° C., respectively.

As is apparent from FIG. 10, it is seen that the $Co_2Fe(Si_{0.5}Al_{0.5})$ thin film 3 fabricated in Example 2 has had a (001) orientation since before the heat treatment and the Cr buffer layer used improves the (001) orientation.

The inserted graph in FIG. 10 illustrates X-ray diffraction patterns of the specimens having the $Co_2Fe(Si_{0.5}Al_{0.5})$ thin films 3 formed at room temperature and then heat-treated at 400° C., 450° C. and 500° C. It shows X-ray diffraction patterns in the case where the angle is set at the (111) diffraction line corresponding to the ordered phase of $L2_1$ structure and then changed by rotation in the film plane. It is seen that in the $Co_2Fe(Si_{0.5}Al_{0.5})$ thin films 3 heat-treated at 450° C. or more, a (111) diffraction pattern is obtained and a $L2_1$ structure is obtained. It has thus been found that in the $Co_2Fe(Si_{0.5}Al_{0.5})$ thin films 3 fabricated by inserting the buffer layer 4 on the MgO substrate in Example 2, the $L2_1$ structure is obtained at a lower temperature than if the buffer layer 4 is not used.

Figure 11:
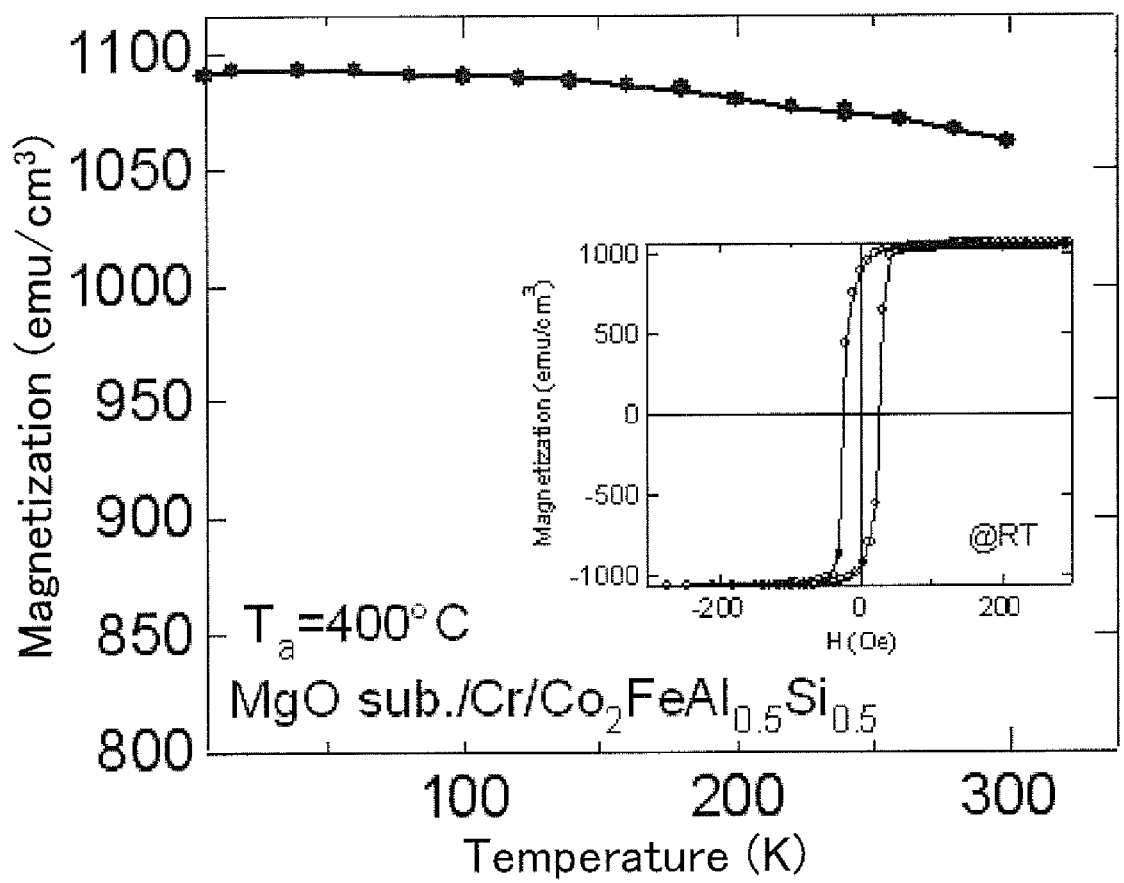
FIG. 11 is a graph illustrating a temperature dependence of the magnetization of the $Co_2Fe(Si_{0.5}Al_{0.5})$ thin film of Example 2.

FIG. 11 shows a temperature dependence of the magnetization of the $Co_2Fe(Si_{0.5}Al_{0.5})$ thin film 3 of Example 2. In FIG. 11, the ordinate axis represents the magnetization (in $emu/cm^3$) and the abscissa axis represents the temperature (in K). The $Co_2Fe(Si_{0.5}Al_{0.5})$ thin film 3 was heat-treated at 400° C. for 1 hour. As is apparent from FIG. 11, it is seen that the $Co_2Fe(Si_{0.5}Al_{0.5})$ thin film 3 of Example 2 has values of magnetization of about 1090 $emu/cm^3$ and about 1060 $emu/cm^3$ in the vicinity of the He temperature and at 300 K, respectively. It has been found that it has a small change in magnetization with temperature change and it is a ferromagnet having high Curie temperature.

The inserted graph in FIG. 11 illustrates a magnetization curve at room temperature of the $Co_2Fe(Si_{0.5}Al_{0.5})$ thin film 3 in Example 2. In the inserted graph, the ordinate axis represents the magnetization (in $emu/cm^3$) and the abscissa axis represents the applied magnetic field H (in Oe). As is apparent from the inserted graph, it has been found that the $Co_2Fe(Si_{0.5}Al_{0.5})$ thin film 3 in Example 2 exhibits a soft magnetic property with a small coercive force.

EXAMPLE 3

As Example 3, a tunneling magnetoresistance effect device (MTJ) 15 of spin valve type as shown in FIG. 5 was fabricated.

First, a Cr buffer layer 4 of 40 nm and a $Co_2Fe(Si_{0.5}Al_{0.5})$ thin film 3 of 30 nm as a ferromagnetic free layer on the buffer layer 4 were deposited on a substrate 2 of MgO (001) by using the magnetron sputtering system. The $Co_2Fe(Si_{0.5}Al_{0.5})$ thin film 3 after deposition was heat-treated at 400° C. to improve its crystal quality. The heat-treated $Co_2Fe(Si_{0.5}Al_{0.5})$ thin film 3 had a B2 structure.

Subsequently, 1.2 nm of AlOx layer as a tunneling insulator layer 11, 3 nm of CoFe layer as a ferromagnetic pinned layer 12, 10 nm of IrMn layer as an antiferromagnetic layer 13 having a role to pin spin of the CoFe layer and 5 nm of Ta layer as an electrode layer 14 performing roles also as a protective layer and further for becoming mask in micro-fabrication were successively formed by deposition in this order. When the CoFe pinned layer 12 is deposited, heat treatment was conducted at temperature of 250° C. under a magnetic field. Specifically, a magnetic field of 2 kOe was applied to develop an exchange anisotropy in a ferromagnetic layer.

And then, the multi-layered film thus formed by deposition was micro-fabricated by using photolithography and ion milling. Thus, a tunneling magnetoresistance effect device 15 of spin valve type having a size of 10 μm×10 μm was fabricated.

Magnetic resistance of the tunneling magnetoresistance effect device 15 in Example 3 was measured at room temperature on applying an external magnetic field thereto.

Figure 12:
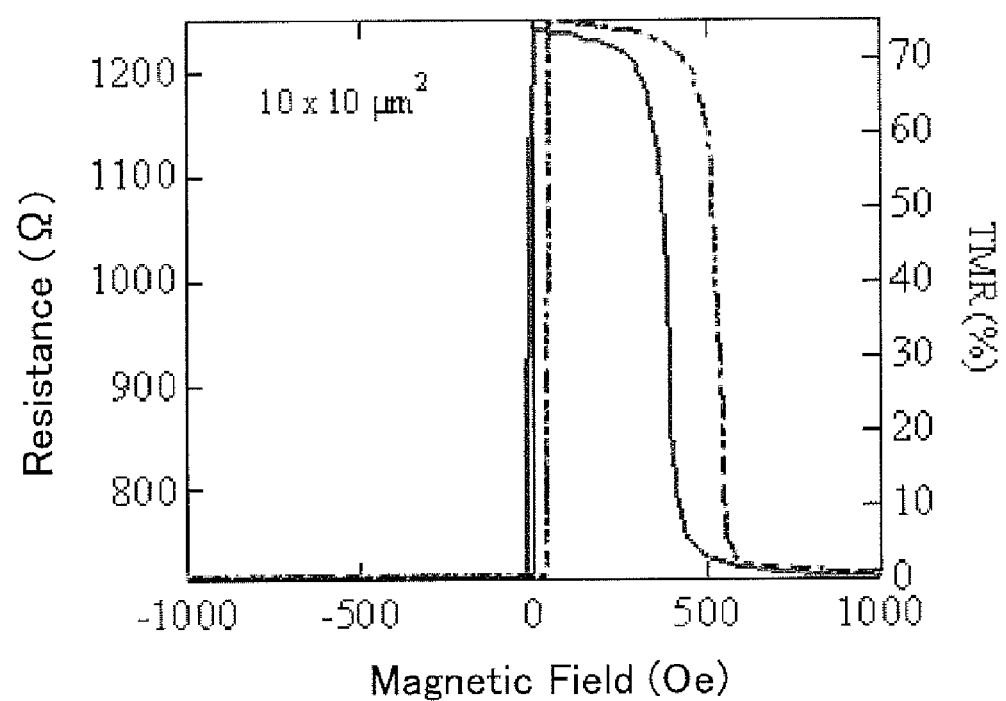
FIG. 12 is a graph illustrating a magnetic field dependence of the resistance of a tunneling magnetoresistance effect device of Example 3 at room temperature.

FIG. 12 shows a magnetic field dependence of the resistance of the tunneling magnetoresistance effect device 15 in Example 3 at room temperature. In the graph, the abscissa axis represents the external magnetic field H (Oe) while the ordinate axis on the left hand side represents the resistance (Ω) and the ordinate axis on the right hand side represents the TMR (%) calculated from the measured resistance. The graph by the solid and dotted lines denotes the resistance value measured as the external magnetic field was swept, exhibiting a TMR of 75% at room temperature. This TMR value is higher than those obtained using the conventional CoFe alloy and CoFeB alloy. Also, junction resistance RA was found to be as small as $RA=1.2\times10^5 \Omega\mu m^2$.

Figure 13:
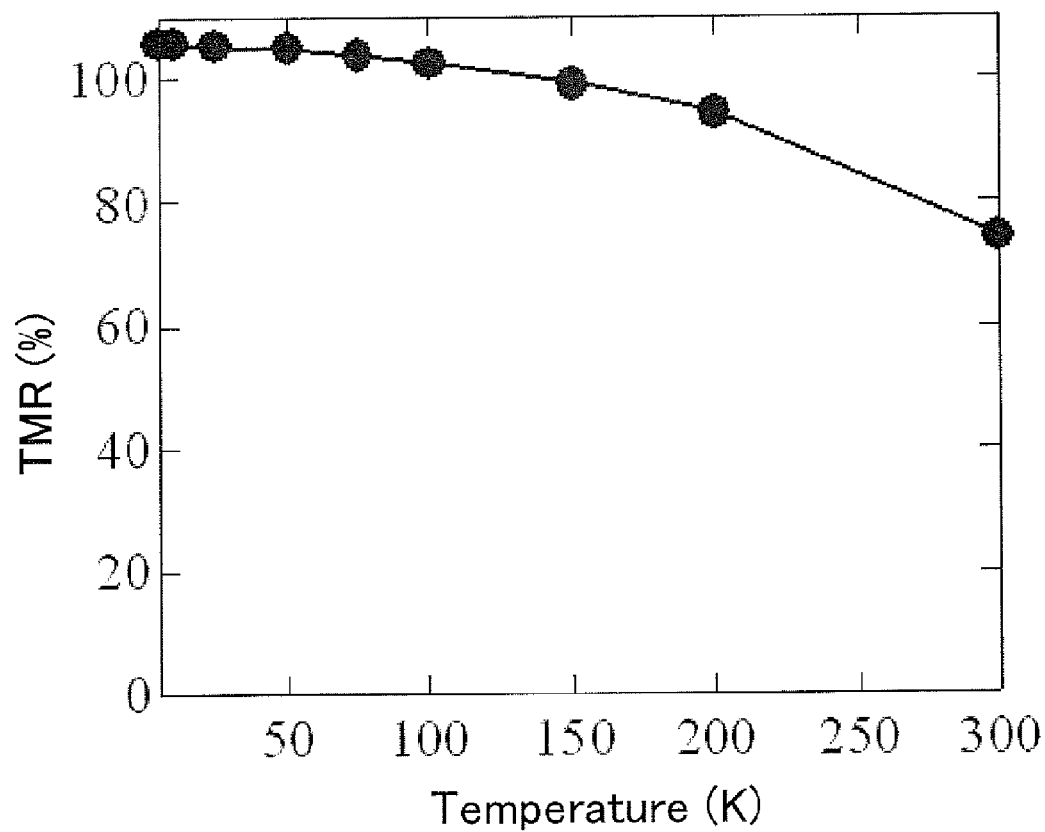
FIG. 13 is a graph illustrating a temperature magnetic field dependence of the TMR in the tunneling magnetoresistance effect device of Example 3.

FIG. 13 is a graph illustrating a temperature magnetic field dependence of the TMR in the tunneling magnetoresistance effect device 15 in Example 3. In the graph, the abscissa axis represents the temperature (in K) and the ordinate axis represents the TMR (%). As is apparent from FIG. 13 it has been found that the TMR obtained was 100% or more at a low temperature of 50 K, reaching 110% at the maximum. To find the spin polarization P of $Co_2Fe(Si_{0.5}Al_{0.5})$ using the Jullier equation (1), it is found that P=0.71. This spin polarization is a value considerably higher than 0.6 that is the maximum value with the conventional CoFeB alloy.

EXAMPLE 4

A tunneling magnetoresistance effect device 15 of Example 4 was fabricated in the same manner as in Example 3 except that composition parameter x was 0.1 in $Co_2Fe(Si_{1-x}Al_x)$ to constitute the ferromagnetic free layer 3 with a $Co_2Fe(Si_{0.1}Al_{0.9})$ thin film. The TMR at room temperature was then about 63%.

EXAMPLE 5

A tunneling magnetoresistance effect device 15 of Example 5 was fabricated in the same manner as in Example 3 except that composition parameter x was 0.3 in $Co_2Fe(Si_{1-x}Al_x)$ to constitute the ferromagnetic free layer 3 with a $Co_2Fe(Si_{0.3}Al_{0.7})$ thin film. The TMR at room temperature was then about 70%.

EXAMPLE 6

A tunneling magnetoresistance effect device 15 of Example 6 was fabricated in the same manner as in Example 3 except that composition parameter x was 0.6 in $Co_2Fe(Si_{1-x}Al_x)$ to constitute the ferromagnetic free layer 3 with a $Co_2Fe(Si_{0.6}Al_{0.4})$ thin film. The TMR at room temperature was then about 80%.

EXAMPLE 7

A tunneling magnetoresistance effect device 15 of Example 7 was made in the same manner as in Example 3 except that composition parameter x was 0.7 in $Co_2Fe(Si_{1-x}Al_x)$ to constitute the ferromagnetic free layer 3 with a $Co_2Fe(Si_{0.7}Al_{0.3})$ thin film. The TMR at room temperature was then about 77%.

EXAMPLE 8

A tunneling magnetoresistance effect device 15 of Example 8 was fabricated in the same manner as in Example 3 except that composition parameter x was 0.9 in $Co_2Fe(Si_{1-x}Al_x)$ to constitute the ferromagnetic free layer 3 with a $Co_2Fe(Si_{0.7}Al_{0.3})$ thin film. The TMR at room temperature was then about 69%.

Next, comparative examples in comparison with Examples 3 to 8 will be described.

COMPARATIVE EXAMPLE 1

A tunneling magnetoresistance effect device of Comparative Example 1 was fabricated in the same manner as in Example 3 except that composition parameter x was 0 in $Co_2Fe(Si_{1-x}Al_x)$ thus to constitute the ferromagnetic free layer 3 with a $Co_2FeSi$ thin film. The TMR at room temperature was then about 41%.

COMPARATIVE EXAMPLE 2

A tunneling magnetoresistance effect device of Comparative Example 2 was fabricated in the same manner as in Example 3 except that composition parameter x was 1 in $Co_2Fe(Si_{1-x}Al_x)$ thus to constitute the ferromagnetic free layer 3 with a $Co_2FeAl$ thin film. The TMR at room temperature was then about 53%.

Figure 14:
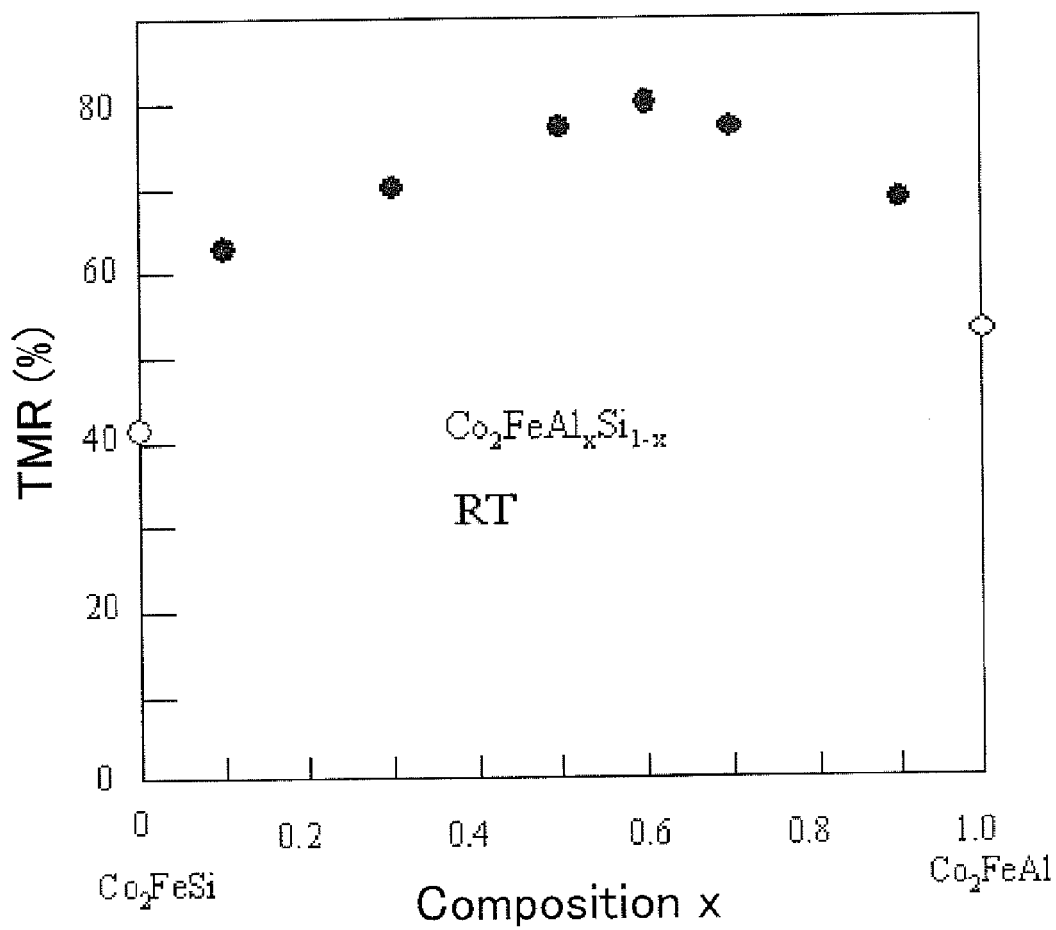
FIG. 14 is a graph illustrating a composition dependence of the TMR of a $Co_2Fe(Si_{1-x}Al_x)$ thin film in the tunneling magnetoresistance effect device of Examples 3-8 and Comparative Examples 1-2 at room temperature.

FIG. 14 is a graph illustrating a composition dependence of the TMR of a $Co_2Fe(Si_{1-x}Al_x)$ thin film in the tunneling magnetoresistance effect devices of Examples 3 to 8 and Comparative Examples 1 and 2 at room temperature. In the graph, the abscissa represents composition parameter x and the ordinate axes represent the TMR (in %). Comparative Example 1 of $Co_2FeSi$ and Comparative Example 2 of $Co_2FeAl$ are shown where in the $Co_2Fe(Si_{1-x}Al_x)$, x=0 and x=1, respectively.

As is apparent from FIG. 14, it has been found that the tunneling magnetoresistance effect devices in Examples 3 to 8 have TMRs as large as about 63% to 80% maximum when parameter x in composition $Co_2Fe(Si_{1-x}Al_x)$ is 0.1 to 0.9 and that any of the Heusler alloys according to the present invention exhibits TMRs more than 60%, having high spin polarizability.

On the other hand, it has been found that the tunneling magnetoresistance effect devices using the $Co_2FeSi$ thin film in Comparative Example 1 and the $Co_2FeAl$ thin film in Comparative Example 2 have TMRs of about 41% and 53% at room temperature, respectively, both of which are lower than those of the tunneling magnetoresistance elements using the thin films 3 of $Co_2Fe(Si_{1-x}Al_x)$ where 0<x<1 of Examples 3 to 8.

EXAMPLE 9

As Example 9, a tunneling magnetoresistance effect device (MTJ) 20 of spin valve type was fabricated.

First, 40 nm of a buffer layer 4 consisting of Cr, 30 nm of $Co_2Fe(Si_{0.5}Al_{0.5})$ layer as a ferromagnetic free layer 3 on the buffer layer 4, 2 nm of MgO layer as a tunneling insulator layer 11 and 30 nm of a $Co_2Fe(Si_{0.5}Al_{0.5})$ layer were deposited on a substrate 2 of MgO (001) by using the high-frequency magnetron sputtering system. The $Co_2Fe(Si_{0.5}Al_{0.5})$ thin film 3 after deposition was heat-treated at 400° C. to improve its crystal quality. The heat-treated $Co_2Fe(Si_{0.5}Al_{0.5})$ thin film 3 had a B2 structure.

Subsequently, 3 nm of CoFe layer as a ferromagnetic pinned layer 16, 10 nm of IrMn layer as an antiferromagnetic layer 13 having a role to fix spin of the pinned layer 16 and 5 nm of Ta layer as an electrode layer 14 performing roles also as a protective layer and further for mask in micro-fabrication were deposited successively. And then, magnetic heat treatment was effected at a temperature of 500° C. under a magnetic field, followed by cooling to room temperature to develop an exchange anisotropy in the pinned layer 16 constituted by the $Co_2Fe(Si_{0.5}Al_{0.5})$ and CoFe layers.

The multi-layered film thus formed by deposition was micro-fabricated by using photolithography and ion milling. Thus, a tunneling magnetoresistance effect device 20 of spin valve type having a size of 10 μm×10 μm was fabricated.

The magnetoresistance of the tunneling magnetoresistance effect device 20 (MTJ) of spin valve type in Example 9 was measured at room temperature on applying an external magnetic field thereto. As a result, TMRs as extremely large as 254% at 5 K and 170% at room temperature were obtained. This also signifies that when a MgO barrier is used as the tunneling insulator layer 11, equation (1) gives rise to a large value of 0.75 for the spin polarization of the $Co_2Fe(Si_{0.5}Al_{0.5})$ thin film 3. Also, junction resistance RA was found to be as small as RA=0.8×10⁵ Ωμm².

EXAMPLE 10

As Example 10, a giant magnetoresistance effect device 35 of spin valve type having CPP structure (CPP-GMR device) as shown in FIG. 8 was fabricated.

First, 40 nm of a buffer layer 4 consisting of Cr and 30 nm of a $Co_2Fe(Si_{0.5}Al_{0.5})$ thin film 3 as a ferromagnetic free layer on the Cr buffer layer 4 are deposited on a substrate 2 of MgO (001) at room temperature by using the high-frequency magnetron sputtering system. The $Co_2Fe(Si_{0.5}Al_{0.5})$ thin film 3 after deposition was heat-treated at 400° C. to improve its crystal quality. The heat-treated $Co_2Fe(Si_{0.5}Al_{0.5})$ thin film 3 had a $L2_1$ structure.

Subsequently, 3 nm of Cu layer as a nonmagnetic metal layer 21, 3 nm of CoFe layer as a ferromagnetic pin layer 22, 10 nm of IrMn layer as an antiferromagnetic layer 13 having a role to pin spin of the CoFe layer 22 and 5 nm of Ta layer as an electrode layer 14 performing roles also as a protective layer and further for mask in micro-fabrication were successively deposited.

And then, magnetic heat treatment was effected at temperature of 250° C. under a magnetic field of 2 kOe to develop an exchange anisotropy in the pinned layer 22 constituted by the CoFe layer.

The multi-layered film thus formed by deposition was micro-fabricated by using photolithography and ion milling. Thus, a giant magnetoresistance effect device 35 of spin valve type having a size of 10 μm×10 μm was fabricated.

The magnetoresistance of the giant magnetoresistance effect device 35 of spin valve type having CPP structure in Example 10 was measured at room temperature on applying an external magnetic field thereto. As a result, a CPP-GMR of 5% was obtained. This is an extremely large value when the fact is taken into account that the conventional giant magnetoresistance effect device of spin valve type having CPP structure has had only a CPP-GMR value that is less than 1%. This is the reflection of large spin polarization of the thin film 3 of $Co_2Fe(Si_{0.5}Al_{0.5})$ used as the ferromagnetic free layer in Example 10. Also the contribution is assumed to be that the $Co_2Fe(Si_{0.5}Al_{0.5})$ thin film 3 has a resistivity of about 190 $\mu\Omega\cdot cm$ and that IrMn used in the antiferromagnetic layer has a value of specific resistance that is equal to about 200 $\mu\Omega\cdot cm$.

EXAMPLE 11

Giant magnetoresistance effect devices 35 of spin valve type in CPP structure in Example 11 were fabricated in the same manner as in Example 10 except that parameter x in composition $Co_2Fe(Si_{1-x}Al_x)$ constituting a ferromagnetic free layer 3 was taken from various values between 0 and 1, excluding 0.5 of Example 10. It has been found that any of their CPP-GMRs is not less than 3%, much larger than those of the conventional giant magnetoresistance effect devices of spin valve type in CPP structure in which the ferromagnetic free layer was constituted with a conventional alloy.

EXAMPLE 12

As Example 12, a tunneling magnetoresistance effect device of spin valve type (MTJ) 20 was fabricated in the same manner as in Example 9.

First, 40 nm of a buffer layer 4 consisting of Cr, 30 nm of $Co_2Fe(Si_{0.5}Al_{0.5})$ layer as the ferromagnetic free layer 3 on the buffer layer 4, a MgO layer as the tunneling insulator layer 11 and 5 nm of a $Co_2Fe(Si_{0.5}Al_{0.5})$ layer were deposited on a substrate 2 of MgO (001) by using the high-frequency magnetron sputtering system. The $Co_2Fe(Si_{0.5}Al_{0.5})$ thin film 3 after deposition was heat-treated at 400° C. to improve its crystal quality. The heat-treated $Co_2Fe(Si_{0.5}Al_{0.5})$ thin film 3 had a B2 structure.

Subsequently, 3 nm of CoFe layer as a ferromagnetic pinned layer 16, 10 nm of IrMn layer as an antiferromagnetic layer 13 having a role to pin spin of the pinned layer 16 and 2 nm of Ta layer as an electrode layer 14 performing roles also as a protective layer and further for mask in micro-fabrication were successively deposited.

And then, magnetic heat treatment was effected at various temperatures to develop an exchange anisotropy in the pinned layer 16 constituted by the $Co_2Fe(Si_{0.5}Al_{0.5})$ and CoFe layers.

The multi-layered film thus formed by deposition was micro-fabricated by using photolithography and ion milling. Thus, a tunneling magnetoresistance effect device of spin valve type 20 having a size of 10 μm×10 μm was fabricated.

Example 12 differs from the tunneling magnetoresistance effect devices 20 of spin valve type in Example 9 that it alters the thickness of the MgO layer as the tunneling insulator layer 11 and changes the heat treatment temperature for the $Co_2Fe(Si_{0.5}Al_{0.5})$ layer 3 as the ferromagnetic free layer to be from 275° C. to 525° C. at intervals of about 25° C.

Figure 15:
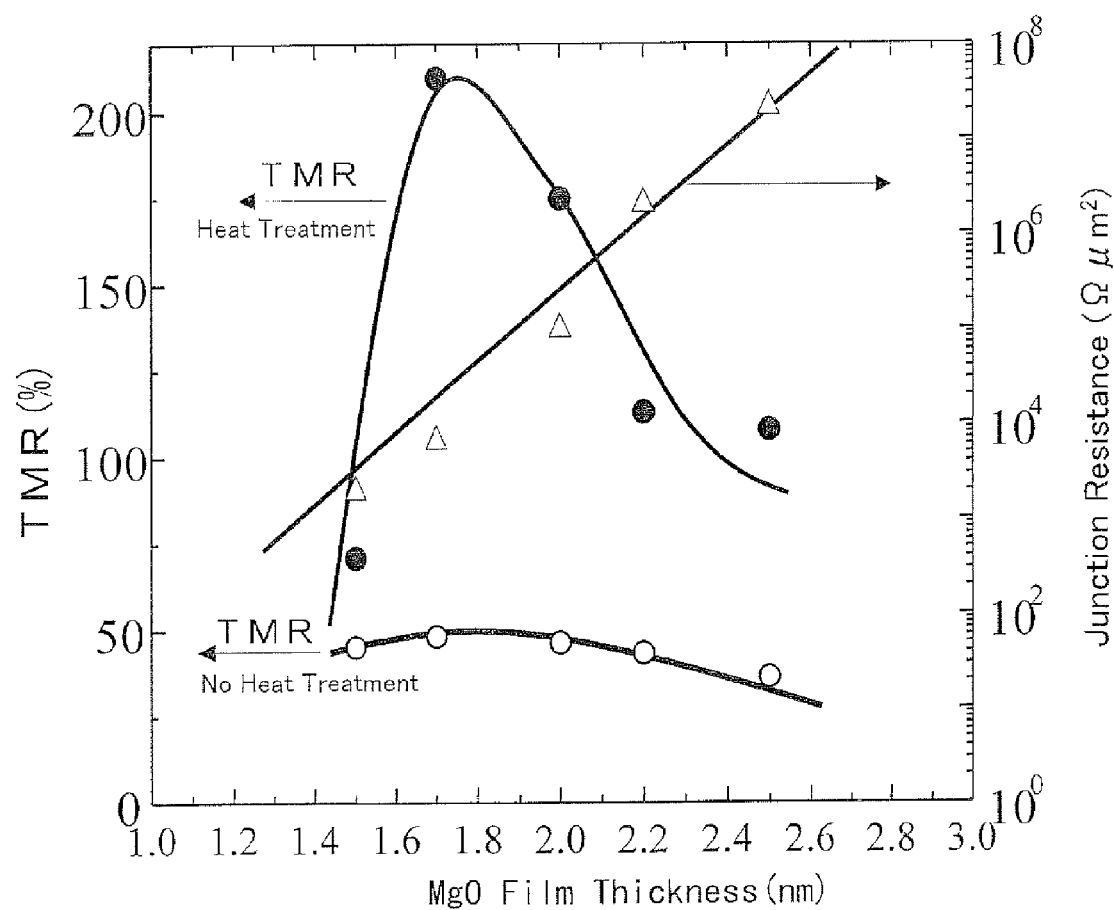
FIG. 15 is a graph illustrating dependences at room temperature on film thickness of MgO layer of the TMR and the junction resistance in a tunneling magnetoresistance effect device of Example 12.

FIG. 15 illustrates dependences on film thickness of MgO layer 11 of the TMR and the junction resistance at room temperature in the tunneling magnetoresistance effect device 20 of Example 12. In the graph, the abscissa axis represents the film thickness (in nm) of the MgO layer 11 while the ordinate axis at the left hand side represents the TMR (in %) and the ordinate axis on the right hand side represents the junction resistance (in $\Omega\mu m^2$). Black circles (●) and white triangles (Δ) are plotted to indicate the largest TMRs obtained when the $Co_2Fe(Si_{0.5}Al_{0.5})$ layer 3 was heat-treated and the corresponding junction resistances then obtained. Circles (○) indicate the TMRs obtained when no heat treatment was applied on the $Co_2Fe(Si_{0.5}Al_{0.5})$ layer 3.

As is apparent from FIG. 15, it was found that the tunneling magnetoresistance effect device 20 in Example 12 had TMRs of 70%, 210%, 175%, 113% and 108% when the MgO layer 11 therein had film thicknesses of 1.5 nm, 1.7 nm, 2 nm, 2.2 nm and 2.5 nm, respectively. They had the maximum TMR (210%) obtained when the MgO layer 11 was of 1.7 nm thickness. It is found that these TMR values are all higher than those when no heat treatment was applied on the $Co_2Fe(Si_{0.5}Al_{0.5})$ thin film 3.

The tunneling magnetoresistance effect device 20 in Example 12 had junction resistances of $2\times10^3 \Omega\mu m^2$, $7\times10^3 \Omega\mu m^2$, $1\times10^5 \Omega\mu m^2$, $2\times10^6 \Omega\mu m^2$ and $2\times10^7 \Omega\mu m^2$, when the MgO layer 11 therein had film thicknesses of 1.5 nm, 1.7 nm, 2 nm, 2.2 nm and 2.5 nm, respectively. It has been found that the junction resistance increases logarithmically as the film thickness of the MgO layer 11 is increased.

Figure 16:
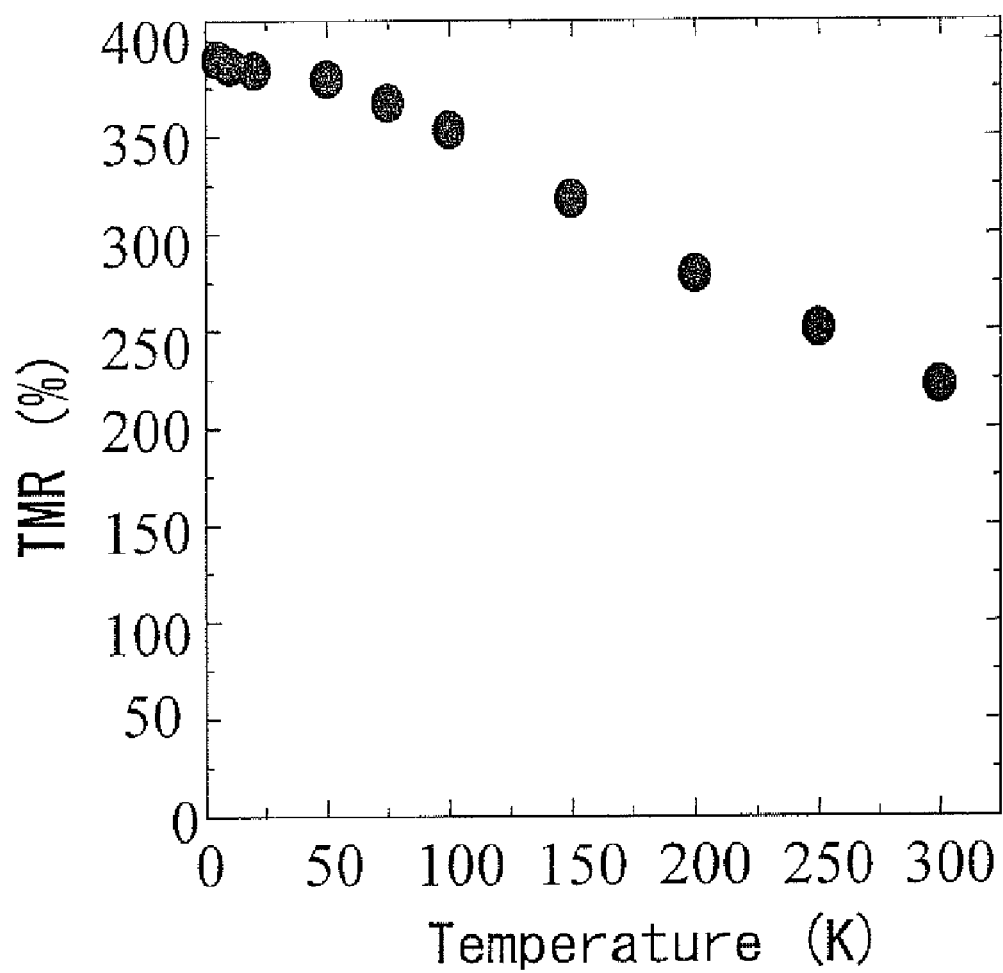
FIG. 16 is a graph illustrating a temperature dependence of the TMR in a tunneling magnetoresistance effect device of Example 12 in which MgO had a film thickness of 1.7 nm and the $Co_2Fe(Si_{0.5}Al_{0.5})$ thin film was heat-treated at temperature of 430° C.

FIG. 16 is a graph illustrating a temperature dependence of the TMR in the tunneling magnetoresistance effect device of Example 12 in which MgO layer 11 had a film thickness of 1.7 nm and the $Co_2Fe(Si_{0.5}Al_{0.5})$ thin film 3 was heat-treated at temperature of 430° C. In the graph, the ordinate axis represents the TMR (in %) and the abscissa axis represents the measurement temperature (in K).

As is apparent from FIG. 16, it has been found that the TMR is 220% at room temperature and as the temperature is lowered, it has a value as very high as 390% at measurement temperature of 5 K. Using the Jullier equation (1) to find the spin polarizability of the $Co_2Fe(Si_{0.5}Al_{0.5})$ thin film 3, it is shown that P=0.81. This value of spin polarization is seen to be higher than that calculated in Example 3.

Figure 17:
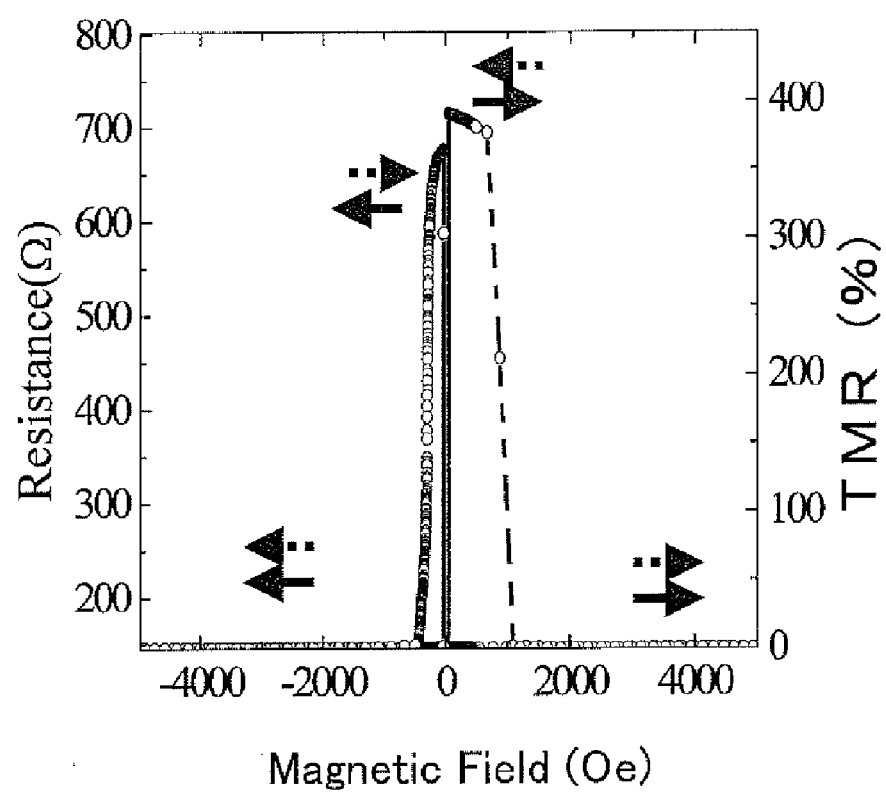
FIG. 17 is a graph illustrating a magnetic field dependence of the resistance of the tunneling magnetoresistance effect device at 5K in FIG. 16.

FIG. 17 shows a magnetic field dependence of the resistance at 5 K of the tunneling magnetoresistance effect device in FIG. 16. The abscissa axis represents the external magnetic field H (in Oe), the ordinate at the left hand side is the resistance (in Ω) and the ordinate axis at the right hand side represents the TMR (in %) calculated from the measured resistance. The solid and broken lines in the graph denote the resistance obtained when the external magnetic field is swept. This yielded a TMR of 390% at 5 K. This TMR value was larger than that in the case where the conventional CoFe or CoFeB alloy was used.

Figure 18:
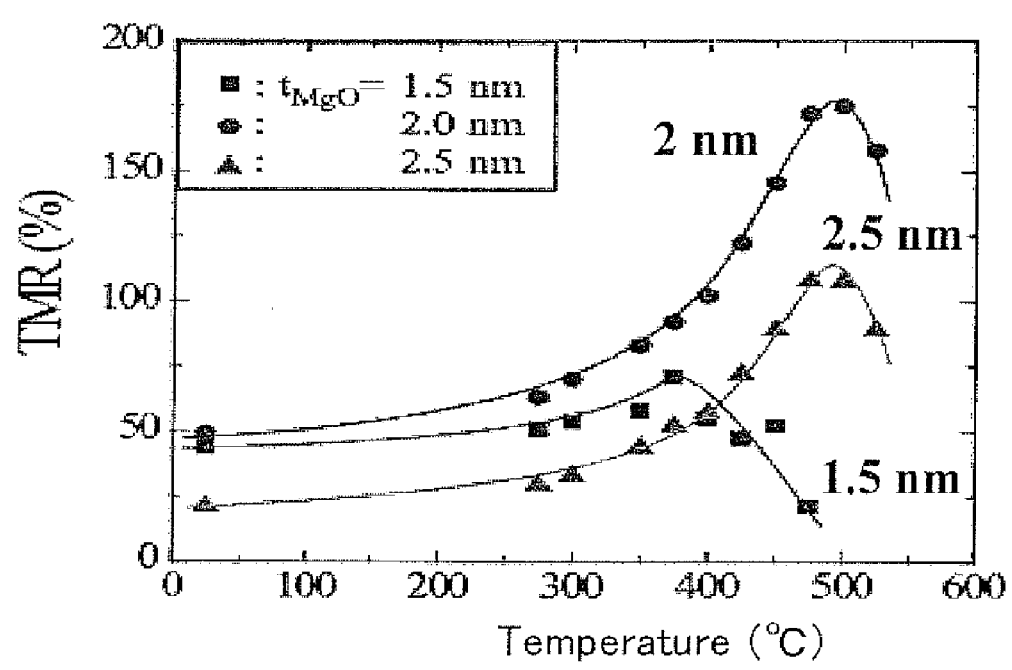
FIG. 18 is a graph illustrating a dependence on heat treatment temperature of the TMR in the tunneling magnetoresistance effect device of Example 12.

FIG. 18 shows a dependence on heat treatment temperature of the TMR in the tunneling magnetoresistance effect device 20 of Example 12. In the graph, the ordinate axis represents the TMR (in %) at room temperature and the abscissa axis represents the heat treatment temperature (in ° C.). Black squares (■), black circles (●) and black triangles (▲) are plotted to indicate values when the MgO layer as the tunneling insulator layer 11 has thicknesses of 1.5 nm, 2 nm and 2.5 nm, respectively.

As is apparent from FIG. 8, TMR with the MgO layer 11 having a film thickness of 1.5 nm was about 50%, about 55%, about 60%, about 70%, about 55%, about 48%, about 52% and about 22% when the $Co_2Fe(Si_{0.5}Al_{0.5})$ thin film 3 was heat-treated at temperature of 275° C., 300° C., 350° C., 375° C., 400° C., 425° C., 450° C. and 475° C., respectively. TMR then with the $Co_2Fe(Si_{0.5}Al_{0.5})$ thin film 3 not heat-treated was about 45%.

TMR with the MgO layer 11 having a film thickness of 2 nm was about 63%, about 70%, about 83%, about 92%, about 103%, about 123%, about 147%, about 172%, about 175% and about 158% when the $Co_2Fe(Si_{0.5}Al_{0.5})$ thin film 3 was heat-treated at temperature of 275° C., 300° C., 350° C., 375° C., 400° C., 425° C., 450° C., 475° C., 500° C. and 525° C., respectively. TMR then with the $Co_2Fe$ ($Si_{0.5}Al_{0.5}$) thin film 3 not heat-treated was about 50%.

TMR with the MgO layer 11 having a film thickness of 2.5 nm was about 30%, about 35%, about 45%, about 52%, about 58%, about 72%, about 90%, about 110%, about 110% and about 90% when the $Co_2Fe(Si_{0.5}Al_{0.5})$ thin film 3 was heat-treated at temperature of 275° C., 300° C., 350° C., 375° C., 400° C., 425° C., 450° C., 475° C., 600° C. and 525° C., respectively. TMR then with the $Co_2Fe(Si_{0.5}Al_{0.5})$ thin film 3 not heat-treated was about 23%.

From the results mentioned above, it is seen that whichever thickness the MgO layer 11 has, the TMR increases as the heat treatment temperature is raised and, becoming maximum at different temperature for a thickness of the MgO layer 11, then decreases. With a thickness of 1.5 nm of the MgO layer 11, it is seen that the TMR becomes maximum when the heat treatment temperature is 375° C. and, standing higher than where no heat treatment is effected until heat treatment temperature of about 425° C. is reached. When the heat treatment is effected at temperature of more than about 425° C., TMR becomes lower than where no heat treatment is conducted.

With thicknesses of 2 nm and 2.5 nm of the MgO layer 11, the TMR becomes maximum when the heat treatment temperature is 500° C. Especially where the thickness of the MgO layer 11 is 2 nm, the TMR can have values of about 75% to 175% at heat treatment temperatures of 300° C. to 525° C.

Note also that where the thickness of the MgO layer 11 is 1.7 nm though not illustrated, a TMR value of 200% or more was attained at the maximum at heat treatment temperature of 430° C.

Figure 19:
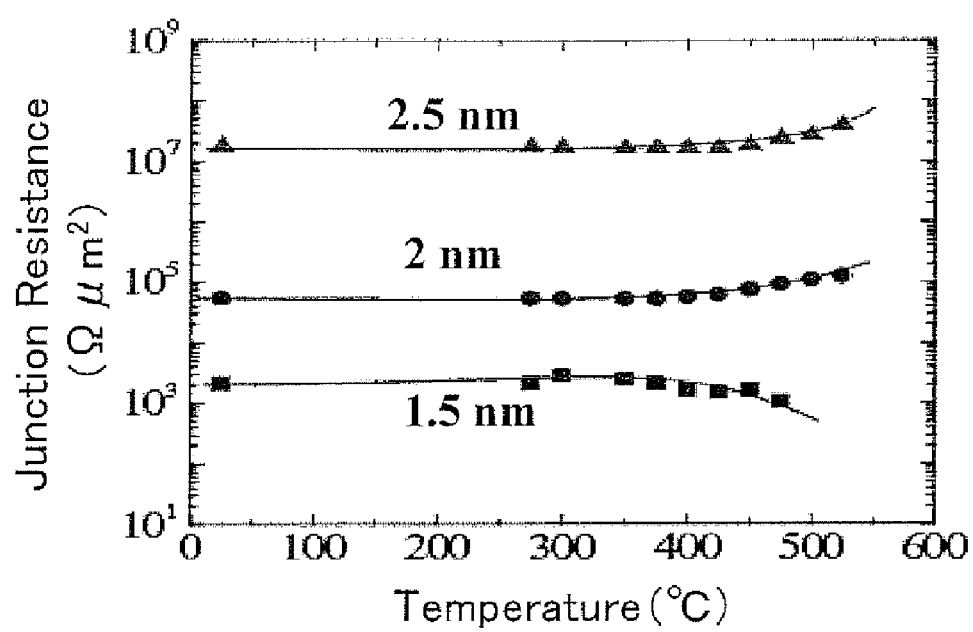
FIG. 19 is a graph illustrating a dependence on heat treatment temperature of the junction resistance in the tunneling magnetoresistance effect device of Example 12.

FIG. 19 shows a dependence on heat treatment temperature of the junction resistance in the tunneling magnetoresistance effect device 20 of Example 12. In the graph, the ordinate axis represents the junction resistance (in $\Omega\mu m^2$) and the abscissa axis represents the heat treatment temperature (in ° C.). Black squares (■), black circles (●) and black triangles (▲) are plotted to indicate values when the MgO layer as the tunneling insulator layer 11 has thicknesses of 1.5 nm, 2 nm and 2.5 nm, respectively.

As is apparent from FIG. 19, with a film thickness of 1.5 nm of the MgO layer 11, the junction resistance was about $2\times10^3$ $\Omega\mu m^2$ identical to where no heat treatment was effected in all the cases where the $Co_2Fe(Si_{0.5}Al_{0.5})$ thin film 3 was heat-treated at temperature of 275° C., 300° C., 350° C. and 375° C. The junction resistance was about $1.5\times10^3$ $\Omega\mu m^2$ when the heat treatment temperature was 400° C., 425° C. and 450° C. The junction resistance was about $1\times10^3$ $\Omega\mu m^2$ when the heat treatment temperature was 475° C.

With a film thickness of 2 nm of the MgO layer 11, the junction resistance was about $5\times10^4$ $\Omega\mu m^2$ identical to where no heat treatment was effected in all the cases where the $Co_2Fe(Si_{0.5}Al_{0.5})$ thin film 3 was heat-treated at temperature of 275° C., 300° C., 350° C., 375° C. and 400° C. It has been found that the junction resistance is about $6\times10^4$ $\Omega\mu m^2$, $7\times10^4$ $\Omega\mu m^2$, $8\times10^4$ $\Omega\mu m^2$ and $1\times10^5$ $\Omega\mu m^2$ when the heat treatment temperature is 425° C., 450° C., 475° C., 500° C. and 525° C., respectively. It has also been found that the junction resistance increases with rise in temperature at the heat treatment temperature of 400° C. or more.

With a film thickness of 2.5 nm of the MgO layer 11, the junction resistance was about $2\times10^7$ $\Omega\mu m^2$ identical to where no heat treatment was effected in all the cases where the $Co_2Fe(Si_{0.5}Al_{0.5})$ thin film 3 was heat-treated at temperature of 275° C., 300° C., 350° C., 375° C., 400° C. and 425° C. It has been found that the junction resistance was about $2.5\times10^7$ $\Omega\mu m^2$, about $3\times10^7$ $\Omega\mu m^2$, about $3\times10^7$ $\Omega\mu m^2$ and about $4\times10^7$ $\Omega\mu m^2$, when the heat treatment temperature was 450° C., 475° C., 500° C. and 525° C., respectively. It has also been found that the junction resistance increases with rise in temperature at the heat treatment temperature of 425° C. or more.

From the results mentioned above, it is seen that up to 400° C. if the heat treatment temperature is increased in Example 12, the junction resistance remains unchanged and almost the same as that where no heat treatment is effected. With a film thickness of 1.5 nm of the MgO layer 11, it has be found that the junction resistance decreases when the heat treatment temperature is 400° C. or more. On the other hand, with film thicknesses of 2 nm and 2.5 nm of the MgO layer 11, the junction resistance increases when the heat treatment temperature is 400° C. or more. It has also been found that as the thickness of the MgO layer 11 is increased, the junction resistance increases.

It should be understood that the present invention is not limited to the specific forms of implementation described above, and various modifications are possible within the scope of the invention set forth in the appended claims. For example, in the case of a tunneling magnetoresistance effect device, a specific composition of $Co_2Fe(Si_{1-x}Al_x)$ (where 0<x<1) thin film 3 constituting a free layer and a specific thickness of a tunnel insulating layer can be suitably designed so that a desired TMR can be attained, which are, needless to say, encompassed within the scope of the present invention.

INDUSTRIAL APPLICABILITY

A magnetic thin film and a magnetoresistance effect device and a magnetic device using the same in accordance with the present invention, which give rise to large TMR and GMR under low magnetic field at room temperature, are suitable for use as magnetic detectors for a variety of electronic instruments and industrial equipments of many kinds and further for medical electronic equipment, which are required to detect magnetic field and to sense magnetic reversal.

What is claimed is:

1. A magnetic thin film characterized in that it comprises a $Co_2Fe(Si_{1-x}Al_x)$ magnetic thin film formed on a substrate, wherein said $Co_2Fe(Si_{1-x}Al_x)$ magnetic thin film has a crystal structure of $L2_1$ or B2 and wherein 0<x<1.

2. The magnetic thin film as set forth in claim 1, characterized in that said substrate is comprised of any one of thermally oxidized Si, glass, MgO single crystal, GaAs single crystal and $Al_2O_3$ single crystal.

3. The magnetic thin film as set forth in claim 1 or claim 2, characterized in that a buffer layer is interposed between said substrate and said $Co_2Fe(Si_{1-x}Al_x)$ magnetic thin film.

4. A tunneling magnetoresistance effect device characterized in that it comprises a substrate, a ferromagnetic layer constituting a free layer, an insulating layer constituting a tunnel barrier, and a ferromagnetic layer constituting a pinned layer, in which:
   either of said ferromagnetic layers is comprised of a $Co_2Fe$ ($Si_{1-x}Al_x$) magnetic thin film (where 0<x<1) formed on said substrate and having a crystal structure of $L2_1$ or B2.

5. A tunneling magnetoresistance effect device characterized in that it comprises a substrate, a ferromagnetic layer constituting a free layer, an insulating layer constituting a tunnel barrier and a ferromagnetic layer constituting a pinned layer, in which:
   said ferromagnetic layer constituting a free layer is comprised of a $Co_2Fe(Si_{1-x}Al_x)$ magnetic thin film (where 0<x<1) formed on said substrate and having crystal structure of $L2_1$ or B2.

6. The tunneling magnetoresistance effect device as set forth in claim 4 or claim 5, characterized in that said substrate is comprised of any one of thermally oxidized Si, glass, MgO single crystal, GaAs single crystal and $Al_2O_3$ single crystal.

7. The tunneling magnetoresistance effect device as set forth in any one of claim 4 to claim 5, characterized in that a buffer layer is interposed between said substrate and said $Co_2Fe(Si_{1-x}Al_x)$ magnetic thin film (where $0<x<1$).

8. A giant magnetoresistance effect device characterized in that it comprises a substrate, a ferromagnetic layer constituting a free layer, a nonmagnetic metal layer, and a ferromagnetic layer constituting a pinned layer, in which:
either of said ferromagnetic layers is comprised of a $Co_2Fe(Si_{1-x}Al_x)$ magnetic thin film (where $0<x<1$) formed on said substrate and having crystal structure of $L2_1$ or B2, said magnetic thin film having an electric current flown therethrough in a direction perpendicular to a film face thereof.

9. A giant magnetoresistance effect device characterized in that it comprises a substrate, a ferromagnetic layer constituting a free layer, a nonmagnetic metal layer and a ferromagnetic layer constituting a pinned layer, in which:
said ferromagnetic layer constituting a free layer is comprised of a $Co_2Fe(Si_{1-x}Al_x)$ magnetic thin film (where $0<x<1$) formed on said substrate and having crystal structure of $L2_1$ or B2, said magnetic thin film having an electric current flown therethrough in a direction perpendicular to a film face thereof.

10. The giant magnetoresistance effect device as set forth in claim 8 or claim 9, characterized in that said substrate is comprised of any one of thermally oxidized Si, glass, MgO single crystal, GaAs single crystal and $Al_2O_3$ single crystal.

11. The giant magnetoresistance effect device as set forth in any one of claim 8 to claim 9, characterized in that a buffer layer is interposed between said substrate and said $Co_2Fe(Si_{1-x}Al_x)$ magnetic thin film (where $0<x<1$).

12. A magnetic device characterized in that it comprises a substrate and a $Co_2Fe(Si_{1-x}Al_x)$ magnetic thin film (where $0<x<1$) formed on said substrate and having a crystal structure of $L2_1$ or B2.

13. The magnetic device as set forth in claim 12, wherein said magnetic device is a tunneling magnetoresistance effect device or a giant magnetoresistance effect device having said $Co_2Fe(Si_{1-x}Al_x)$ magnetic thin film as a ferromagnetic layer for said tunneling magnetoresistance effect device or said giant magnetoresistance effect device.

14. The magnetic device as set forth in claim 12 or claim 13, characterized in that said substrate is comprised of any one of thermally oxidized Si, glass, MgO single crystal, GaAs single crystal and $Al_2O_3$ single crystal.

15. The magnetic device as set forth in any one of claim 12 to claim 13, characterized in that a buffer layer is interposed between said substrate and said $Co_2Fe(Si_{1-x}Al_x)$ magnetic thin film (where $0<x<1$).

16. A magnetic apparatus characterized in that it comprises a substrate and a $Co_2Fe(Si_{1-x}Al_x)$ magnetic thin film (where $0<x<1$) formed on said substrate and having a crystal structure of $L2_1$ or B2.

17. The magnetic apparatus as set forth in claim 16, characterized in that said magnetic apparatus comprises a tunneling magnetoresistance effect device or a giant magnetoresistance effect device having said $Co_2Fe(Si_{1-x}Al_x)$ magnetic thin film as a ferromagnetic layer for said tunneling magnetoresistance effect device or said giant magnetoresistance effect device.

18. The magnetic apparatus as set forth in claim 16 or claim 17, characterized in that said substrate is comprised of any one of thermally oxidized Si, glass, MgO single crystal, GaAs single crystal and $Al_2O_3$ single crystal.

19. The magnetic apparatus as set forth in any one of claim 16 to claim 17, characterized in that a buffer layer is interposed between said substrate and said $Co_2Fe(Si_{1-x}Al_x)$ magnetic thin film (where $0<x<1$).

20. The magnetic apparatus as set forth in any one of claim 16 to claim 17, characterized in that said magnetic apparatus is one of apparatuses of the class which consists of a magnetic sensor, magnetic head, a hard disc driver and an MRAM.

21. The magnetic thin film as set forth in claim 3, characterized in that said buffer layer is composed of at least one of Cr, Ta, V, Nb, Ru, Fe, FeCo alloy and full-Heusler alloy.

22. The tunneling magnetoresistance effect device as set forth in claim 7, characterized in that said buffer layer is composed of at least one of Cr, Ta, V, Nb, Ru, Fe, FeCo alloy and full-Heusler alloy.

23. The giant magnetoresistance effect device as set forth in claim 11, characterized in that said buffer layer is composed of at least one of Cr, Ta, V, Nb, Ru, Fe, FeCo alloy and full-Heusler alloy.

24. The magnetic device as set forth in claim 15, characterized in that said buffer layer is composed of at least one of Cr, Ta, V, Nb, Ru, Fe, FeCo alloy and full-Heusler alloy.

25. The magnetic apparatus as set forth in claim 19, characterized in that said buffer layer is composed of at least one of Cr, Ta, V, Nb, Ru, Fe, FeCo alloy and full-Heusler alloy.

26. The tunneling magnetoresistance effect device as set forth in claim 6, characterized in that a buffer layer is interposed between said substrate and said $Co_2Fe(Si_{1-x}Al_x)$ magnetic thin film (where $0<x<1$).

27. The giant magnetoresistance effect device as set forth in claim 10, characterized in that a buffer layer is interposed between said substrate and said $Co_2Fe(Si_{1-x}Al_x)$ magnetic thin film (where $0<x<1$).

28. The magnetic apparatus as set forth in claim 18, characterized in that said magnetic apparatus is one of apparatuses of the class which consists of a magnetic sensor, magnetic head, a hard disc driver and an MRAM.

29. The magnetic device as set forth in claim 14, characterized in that a buffer layer is interposed between said substrate and said $Co_2Fe(Si_{1-x}Al_x)$ magnetic thin film (where $0<x<1$).

30. The magnetic apparatus as set forth in claim 18, characterized in that a buffer layer is interposed between said substrate and said $Co_2Fe(Si_{1-x}Al_x)$ magnetic thin film (where $0<x<1$).

* * * * *